United States Patent
Kawarada et al.

(10) Patent No.: US 12,457,760 B2
(45) Date of Patent: Oct. 28, 2025

(54) DIAMOND FIELD EFFECT TRANSISTOR AND METHOD FOR PRODUCING SAME

(71) Applicant: WASEDA UNIVERSITY, Tokyo (JP)

(72) Inventors: Hiroshi Kawarada, Tokyo (JP); Wenxi Fei, Tokyo (JP); Te Bi, Tokyo (JP); Masayuki Iwataki, Tokyo (JP)

(73) Assignee: Waseda University, Tokyo (JP)

( * ) Notice: Subject to any disclaimer, the term of this patent is extended or adjusted under 35 U.S.C. 154(b) by 146 days.

(21) Appl. No.: 17/910,325

(22) PCT Filed: Feb. 17, 2021

(86) PCT No.: PCT/JP2021/005918
§ 371 (c)(1),
(2) Date: Sep. 8, 2022

(87) PCT Pub. No.: WO2021/182046
PCT Pub. Date: Sep. 16, 2021

(65) Prior Publication Data
US 2023/0136477 A1    May 4, 2023

(30) Foreign Application Priority Data
Mar. 10, 2020 (JP) ................ 2020-041416

(51) Int. Cl.
*H10D 30/01* (2025.01)
*H01L 21/02* (2006.01)
*H01L 21/04* (2006.01)
*H10D 62/83* (2025.01)

(52) U.S. Cl.
CPC ....... *H10D 30/01* (2025.01); *H01L 21/02527* (2013.01); *H01L 21/0262* (2013.01); *H01L 21/0415* (2013.01); *H10D 62/8303* (2025.01)

(58) Field of Classification Search
CPC ........... H01L 21/02527; H01L 21/0262; H01L 21/0415; H01L 29/66045; H01L 29/1602; H10D 30/01; H10D 62/8303
See application file for complete search history.

(56) References Cited

U.S. PATENT DOCUMENTS

| | | | |
|---|---|---|---|
| 5,254,867 A * | 10/1993 | Fukuda | H01L 21/28194 257/411 |
| 5,523,588 A | 6/1996 | Nishimura et al. | |
| 2020/0176611 A1 * | 6/2020 | Lee | H01L 29/401 |

FOREIGN PATENT DOCUMENTS

| | | |
|---|---|---|
| JP | H10125932 A | 5/1998 |
| JP | 2005175278 A | 6/2005 |

(Continued)

OTHER PUBLICATIONS

Alex Schenk, Anton Tadich, Michael Sear, Kane M. O'Donnell, Lothar Ley, Alastair Stacey, and Chris Pakes, "Formation of a silicon terminated (100) diamond surface", Appl. Phys. Lett. 106, 191603 (2015) https://doi.org/10.1063/1.4921181.
International Search Report issued in PCT/JP2021/005918 dated May 11, 2021.

(Continued)

*Primary Examiner* — Richard A Booth
(74) *Attorney, Agent, or Firm* — Fox Rothschild LLP; Carol E. Thorstad-Forsyth

(57) ABSTRACT

Provided are a diamond field effect transistor using a silicon oxide film as a gate insulating film including a silicon-terminated layer containing C—Si bonds in order to reduce an interface state density, and a method for producing the same. A FET 100A includes a silicon oxide film 3A formed on a surface of a non-doped diamond layer 2A, a non-doped diamond layer 4A formed on a surface of the non-doped diamond layer 2A using the silicon oxide film 3A as a mask, a silicon-terminated layer 5A formed at an interface between the non-doped diamond layer 2A and the silicon oxide film 3A and at an interface between the non-doped diamond layer (Continued)

4A and the silicon oxide film 3A, and a gate electrode 12A formed on the silicon oxide film 3A. The FET 100A operates using the silicon oxide film 3A and an insulating film 10A formed on the silicon oxide film 3A as a gate insulating film 11A and using the non-doped diamond layer 4A as each of a source region and a drain region.

3 Claims, 34 Drawing Sheets

(56) References Cited

FOREIGN PATENT DOCUMENTS

| JP | 2006216716 | A | 8/2006 |
|----|------------|---|--------|
| JP | 2007141974 |   | 6/2007 |
| JP | 2014060377 | A | 4/2014 |
| JP | 2020035917 | A | 3/2020 |

OTHER PUBLICATIONS

Takeshi Hara, Tomohiro Hakamata, Wako Ono, Yuji Seshimo, Yuya Hayashi, Atsushi Hiraiwa and Hiroshi Kawarada "Formation and evaluation of SiO2 gate dielectric films on diamond" Mar. 12, 2015 (1.Waseda Univ.).

Extended European Search Report for European Patent Application No. 21767950.5 dated Mar. 28, 2024 (9 pages).

Fei et al., "Oxidized Si terminated diamond and its MOSFET operation with SiO2 gate insulator," Applied Physics Letters, vol. 116, No. 21, 4 pages (2020).

\* cited by examiner

DIAMOND FIELD EFFECT TRANSISTOR AND METHOD FOR PRODUCING SAME

CROSS-REFERENCES TO RELATED APPLICATION

This application is a U.S. National Stage entry under 35 U.S.C. § 371 based on International Application No. PCT/JP2021/005918 which was filed on Feb. 17, 2021 and claims priority to Japanese Patent Application No. 2020-041416, which was filed on Mar. 10, 2020 and is entitled "DIAMOND FIELD EFFECT TRANSISTOR AND METHOD FOR PRODUCING SAME". The content of the priority applications are hereby incorporated herein in their entirety by reference.

TECHNICAL FIELD

The present invention relates to a diamond field effect transistor and a method for producing the same.

BACKGROUND ART

Diamond is expected as a semiconductor material suitable for a high-power power device that requires a high-voltage and high-current operation. There has been proposed a technique in which a two-dimensional hole gas (2DHG) is induced directly below a surface of a diamond substrate by hydrogen-terminating the surface of the diamond substrate to form C—H bonds, and the diamond substrate operates as a diamond field effect transistor (FET). In a diamond FET, $Al_2O_3$ (alumina) is used as a gate insulating film (for example, PTL 1: JP-A-2014-060377).

On the other hand, a metal-oxide-semiconductor (MOS) type using $SiO_2$ (silicon oxide film) as a gate insulating film is widely used as a FET produced on a Si (silicon) substrate. It is known that a gate insulating film formed of $SiO_2$ has a chemical bond structure more stable than that of a gate insulating film formed of $Al_2O_3$ (alumina) or the like, and has high reliability as an insulating film.

Regarding a technique of Si (silicon)-terminating a surface of a diamond substrate, a result of basic study on a sample in which only a monolayer is prepared has been reported (for example, NPL 1).

CITATION LIST

Patent Literature

PTL 1: JP-A-2014-060377

Non Patent Literature

NPL 1: "Formation of a silicon terminated (100) diamond surface", Alex Schenk, Anton Tadich, Michael Sear, Kane M. O'Donnell, Lothar Ley, Alastair Stacey, and Chris Pakes, APPLIED PHYSICS LETTERS 106, 191603 (2015)

SUMMARY OF INVENTION

Technical Problem

In the diamond FET, an interface state density may increase due to C—O bonds made of C (carbon) atoms and O (oxygen) atoms formed at an interface between the gate insulating film and the diamond substrate, and it has been required to reduce the interface state density in order to put the MOS-type FET into practical use. However, there has not been reported a MOS-type FET in which a silicon oxide film is formed as a gate insulating film on a diamond surface via a layer containing C—Si bonds instead of C—O bonds. Further, it is unclear whether the MOS-type FET in which the silicon oxide film is formed as the gate insulating film on the diamond surface can exhibit characteristics of a level required for a high-power power device that requires a high-voltage and high-current operation. NPL 1 is limited to a stage of basic study on crystallinity using the sample in which a monolayer silicon-terminated layer is formed on a diamond substrate, and there is no report on evaluation of electrical characteristics.

The invention has been made in view of the above circumstances, and an object thereof is to provide a diamond field effect transistor using a silicon oxide film as a gate insulating film including a silicon-terminated layer containing C—Si bonds in order to reduce an interface state density, and a method for producing the same.

Solution to Problem

A diamond field effect transistor according to the invention includes a first diamond layer, a gate insulating film including a silicon oxide film provided on a surface of the first diamond layer, a source region and a drain region provided on the surface of the first diamond layer so as to be separated from each other, and a gate electrode provided on the gate insulating film, wherein a silicon-terminated layer containing C—Si bonds formed of bonds between carbon atoms and silicon atoms is provided at an interface between the first diamond layer and the gate insulating film.

A method for producing a diamond field effect transistor according to the invention includes forming a silicon oxide film on a surface of a first diamond layer, forming each of a source region and a drain region on the surface of the first diamond layer, forming a gate electrode on the gate insulating film, and forming a silicon-terminated layer containing C—Si bonds formed of bonds between carbon atoms and silicon atoms at an interface between the first diamond layer and the silicon oxide film.

Advantageous Effects of Invention

According to the invention, it is possible to provide a diamond field effect transistor capable of reducing an interface state density by including a silicon-terminated layer containing C—Si bonds instead of C—O bonds, and a method for producing the same.

DESCRIPTION OF EMBODIMENTS

First Embodiment

Figure 1:
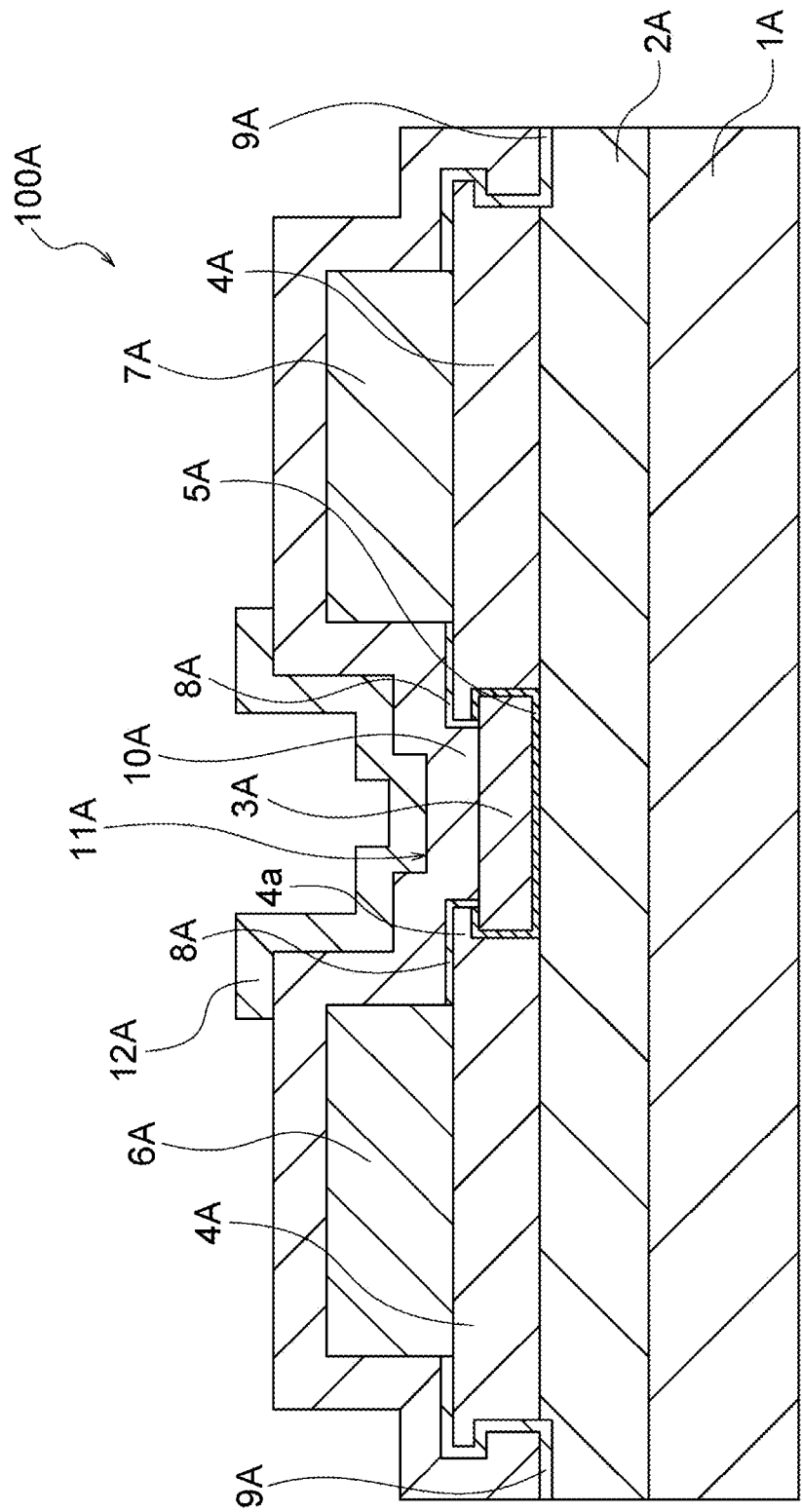
FIG. 1 is a cross-sectional view showing a configuration of a FET according to a first embodiment of the invention.

An overall configuration of a diamond field effect transistor 100A (hereinafter referred to as a FET 100A) according to a first embodiment of the invention will be described with reference to FIG. 1. FIG. 1 is a cross-sectional view showing a configuration of the FET 100A.

In FIG. 1, in the FET 100A according to the first embodiment, a non-doped diamond layer 2A that is epitaxially grown is formed on a diamond substrate 1A. A thickness of the non-doped diamond layer 2A is, for example, in a range of 200 nm or larger and 5 μm or smaller (in the following description, the non-doped diamond layer 2A may be referred to as the diamond layer 2A).

A silicon oxide film 3A is formed in a partial region on the non-doped diamond layer 2A. A thickness of the silicon oxide film 3A is, for example, 250 nm.

A pair of non-doped diamond layers 4A are further formed on the non-doped diamond layer 2A so as to be separated from each other. One of the pair of non-doped diamond layers 4A functions as a source region of the FET 100A, and the other thereof functions as a drain region. In the following description, one of the pair of non-doped diamond layers 4A (left side in the drawing) is referred to as the source-side non-doped diamond layer 4A, and the other thereof (right side in the drawing) is referred to as the drain-side non-doped diamond layer 4A. Alternatively, the non-doped diamond layer 4A may be referred to as the source-side diamond layer 4A or the drain-side diamond layer 4A. In particular, when a source side and a drain side are not distinguished from each other, the non-doped diamond layer 4A is simply referred to as the non-doped diamond layer 4A.

The source-side non-doped diamond layer 4A is in contact with a source-side side surface of the silicon oxide film 3A, and the drain-side non-doped diamond layer 4A is in contact with a drain-side side surface of the silicon oxide film 3A. The source-side and drain-side non-doped diamond layers 4A are layers that are selectively epitaxially grown on the non-doped diamond layer 2A using the silicon oxide film 3A as a mask. A thickness of the non-doped diamond layer 4A is, for example, 300 nm.

An overhang portion 4a having an overhang shape covering apart of an upper surface of the silicon oxide film 3A is formed at an upper end portion of each of the source-side and drain-side non-doped diamond layers 4A. A thickness and a length of the overhang portion 4a change due to a difference between the thickness of the non-doped diamond layer 4A and the thickness of the silicon oxide film 3A. In the present embodiment, as described above, since the thickness of the silicon oxide film 3A is, for example, 250 nm, and the thickness of the non-doped diamond layer 4A is, for example, 300 nm, the difference in thickness is 50 nm. The thickness and the length of the overhang portion 4a are approximately 50 nm corresponding to the difference in thickness.

The overhang portion 4a may be omitted as necessary. When the overhang portion 4a is omitted, the non-doped diamond layer 4A may be formed to be thinner than the silicon oxide film 3A, or may be formed to have a thickness substantially the same as that of the silicon oxide film 3A.

In the following description, forming C—Si bonds by directly bonding Si (silicon) atoms to C (carbon) atoms on a diamond surface is referred to as silicon termination. In the present embodiment, a layer mainly containing the C—Si bonds is referred to as a silicon-terminated layer 5A.

In the present embodiment, as shown in FIG. 1, the silicon-terminated layer 5A containing the C—Si bonds is formed at an interface between the non-doped diamond layer 2A and the silicon oxide film 3A and at interfaces between the non-doped diamond layers 4A and the silicon oxide film 3A. The silicon-terminated layer 5A may be a single layer, and preferably includes a plurality of layers. However, it is not necessary that all C atoms contained in the silicon-terminated layer 5A are bonded to the Si atoms to form the C—Si bonds.

A source electrode 6A is formed on a surface of the source-side non-doped diamond layer 4A, and a drain electrode 7A is formed on a surface of the drain-side non-doped diamond layer 4A. Predetermined intervals are provided between the source electrode 6A and the end portion of the source-side non-doped diamond layer 4A not including the overhang portion 4a, and between the drain electrode 7A and the end portion of the drain-side non-doped diamond layer 4A not including the overhang portion 4a, respectively. Each of the source electrode 6A and the drain electrode 7A has a configuration in which a Ti layer, a Pt layer, and an Au layer are sequentially deposited to form ohmic contacts to the source-side and drain-side non-doped diamond layer 4A. A carbide layer made of TiC is formed between the Ti layer and the non-doped diamond layer 4A. The Ti layer, the Pt layer, the Au layer, and the carbide layer are not shown in FIG. 1.

In the following description, forming C—H bonds by bonding H (hydrogen) to C atoms on a diamond surface is referred to as hydrogen termination. In the present embodiment, a layer mainly containing the C—H bonds is referred to as a hydrogen-terminated layer 8A.

In the present embodiment, the hydrogen-terminated layer 8A is formed on a part of the surface of each of the non-doped diamond layers 4A. Specifically, as shown in FIG. 1, the hydrogen-terminated layer 8A is formed in a region between an end portion of each of the source electrode 6A and the drain electrode 7A and the end portion of each of the non-doped diamond layers 4A including the overhang portions 4a.

The hydrogen-terminated layer 8A induces a two-dimensional hole gas (2DHG) (not shown) inside each of the source-side and drain-side non-doped diamond layers 4A directly below the hydrogen-terminated layer 8A, whereby a p-type conductive layer can be formed. The hydrogen-terminated layer 8A may be omitted according to specifications required for the FET 100A.

An insulating film 10A is formed on the silicon oxide film 3A, the non-doped diamond layers 4A, the source electrode 6A, and the drain electrode 7A. The insulating film 10A may be formed of, for example, $Al_2O_3$ (alumina), and a thickness thereof may be in a range of, for example, 100 nm or larger and 300 nm or smaller. The insulating film 10A may be another insulating film, for example, an aluminum silicate (AlSiO) film or a silicon nitride film (SixNy).

The insulating film 10A on the silicon oxide film 3A constitutes a gate insulating film 11A together with the silicon oxide film 3A. When the thickness of the silicon oxide film 3A is, for example, 250 nm as described above, a thickness of the gate insulating film 11A is, for example, in a range of 350 nm or larger and 550 nm or smaller.

Main characteristics of the FET 100A do not change depending on presence or absence of the insulating film 10A on the silicon oxide film 3A. This is because important characteristics are determined by the silicon oxide film 3A directly formed on a surface of the non-doped diamond layer 2A in a FET having a MOS-type structure such as the FET 100A. More specifically, the characteristics of the FET 100A greatly depend on the interface between the surface of the non-doped diamond layer 2A and the silicon oxide film 3A directly formed on the surface of the non-doped diamond layer 2A. Therefore, the insulating film 10A on the silicon oxide film 3A may be omitted as necessary. When the insulating film 10A on the silicon oxide film 3A is omitted, the gate insulating film 11A is formed of only the silicon oxide film 3A. Adjustment of an amount of change in electrical characteristics of the FET 100A, for example, adjustment of a threshold voltage when the gate insulating film 11A is formed of only the silicon oxide film 3A, can be performed by increasing the thickness of the silicon oxide film 3A.

The insulating film 10A on the non-doped diamond layers 4A functions as a passivation film that protects surfaces of the source-side and drain-side non-doped diamond layers 4A, particularly the hydrogen-terminated layers 8A. Since presence of the hydrogen-terminated layer 8A induces the two-dimensional hole gas in the non-doped diamond layer 4A directly below the hydrogen-terminated layer 8A, it is desirable to protect the non-doped diamond layer 4A by covering the non-doped diamond layer 4A with the insulating film 10A in this manner. The insulating film 10A on the source electrode 6A and the drain electrode 7A functions as an interlayer insulating film that insulates the source electrode 6A and the drain electrode 7A from a gate electrode 12A.

The gate electrode 12A having a thickness of approximately 100 nm is formed on the gate insulating film 11A using, for example, Al (aluminum). A gate length of the FET 100A is defined not by a width of the gate electrode 12A but by a width $L_{SiO2}$ of the silicon oxide film 3A on the non-doped diamond layer 2A. The width of the silicon oxide film 3A is the same as the interval between the source-side non-doped diamond layer 4A and the drain-side non-doped diamond layer 4A not including the overhang portions 4a. In the present embodiment, the interval between the source electrode 6A and the drain electrode 7A is defined as $L_{SD}$.

A device isolation layer 9A insulates a part of the surface of the non-doped diamond layer 2A and a part of the surface of the non-doped diamond layer 4A in a region other than a channel portion of the FET 100A, and electrically isolates the two from each other. The device isolation layer 9A is formed by bonding O atoms to C atoms on the surface of the non-doped diamond layer 2A and the surface of the diamond layer 4A to form C—O bonds.

(Operation Principle)

Next, an operation principle of the FET 100A will be described with reference to FIG. 2. In the following description, a drain voltage is referred to as $V_{DS}$, and a gate voltage is referred to as $V_{GS}$. In the FET 100A, a drain current $I_{DS}$ flowing from the source electrode 6A to the drain electrode 7A is controlled by the gate voltage $V_{GS}$ applied to the gate electrode 12A, and the FET 100A can be switched between ON and OFF. The FET 100A is a FET having a p-channel MOS-type structure, and the drain current $I_{DS}$ is a hole current having a hole H as a carrier.

In related art, a diamond FET operates as a FET by generating a two-dimensional hole gas (2DHG) directly below a surface of a diamond substrate by hydrogen-terminating the surface of the diamond substrate to form C—H bonds. Since the 2DHG is also generated when a gate voltage is 0 V, a hole current always flows when there is a potential difference between a source and a drain. This state is called normally-on, and is one of the problems to be solved particularly in the FET for a power device.

The FET 100A is an enhancement-type FET and achieves a normally-off operation. Even when the FET 100A is in an OFF state ($V_{GS}$=0 V), the two-dimensional hole gas is generated by the C—H bonds of the hydrogen-terminated layer 8A, directly below each of the surfaces of the source-side and drain-side non-doped diamond layers 4A on which the hydrogen-terminated layer 8A is formed. On the other hand, no two-dimensional hole gas is generated on the surface of the non-doped diamond layer 2A where the hydrogen-terminated layer 8A does not exist. Thereby, in the FET 100A, the two-dimensional hole gas generated inside the source-side non-doped diamond layer 4A and the two-dimensional hole gas generated inside the drain-side non-doped diamond layer 4A are separated and do not exist continuously. Therefore, when the FET 100A is in the OFF state ($V_{GS}$=0 V), holes cross from the source-side non-doped diamond layer 4A into the non-doped diamond layer 2A and cannot reach the drain electrode 7A through the drain-side non-doped diamond layer 4A. As a result, no current flows between a source and a drain of the FET 100A, and thus the FET 100A is not normally on.

In order to turn on the FET 100A, for example, set $V_{GS}$=−5 V and $V_{DS}$=−10 V. In order to switch the FET 100A from an ON state to the OFF state, $V_{GS}$=0 V is set while $V_{DS}$=−10 V is maintained. Since the FET 100A is the normally-off enhancement-type FET different from the related-art diamond FET, the FET 100A can be turned off by setting $V_{GS}$=0 V.

Next, a flow of a hole current when the FET 100A is in the ON state will be described. Even when the gate voltage $V_{GS}$ applied to the gate electrode 12A is 0 V, a two-dimensional hole gas is induced by the source-side hydrogen-terminated layer 8A, directly below the surface of the non-doped diamond layer 4A from the end portion of the source electrode 6A to the overhang portion 4a. When the gate voltage $V_{GS}$ and the drain voltage $V_{DS}$ corresponding to the ON state are applied to the FET 100A as described above, the holes H start to move from the source electrode 6A toward the drain electrode 7A. The holes H flow through inside of the source-side overhang portion 4a via the two-dimensional hole gas induced directly below the surface of the non-doped diamond layer 4A including the source-side overhang portion 4a by the source-side hydrogen-terminated layer 8A, reaches vicinity of the silicon-terminated layer 5A existing at the interface between the non-doped diamond layer 4A and the silicon oxide film 3A, and moves inside the non-doped diamond layer 4A toward the non-doped diamond layer 2A (downward direction in FIG. 2) along the silicon-terminated layer 5A. Since the FET 100A uses the non-doped diamond layer 4A having a high resistance, the two-dimensional hole gas is used as described above. When the hydrogen-terminated layer 8A for inducing the two-dimensional hole gas is not provided, an on-current of the FET 100A decreases. In order to improve the characteristics of the FET 100A, it is preferable to form the hydrogen-terminated layer 8A.

Next, the holes H move to the drain side inside the non-doped diamond layer 2A along the silicon-terminated layer 5A at the interface between the non-doped diamond layer 2A and the silicon oxide film 3A. Next, the hole H moves inside the non-doped diamond layer 4A toward the drain-side overhang portion 4a (upward direction in FIG. 2) along the silicon-terminated layer 5A at the interface between the drain-side non-doped diamond layer 4A and the silicon oxide film 3A. The holes H reach the drain electrode 7A via the two-dimensional hole gas induced directly below the surface of the non-doped diamond layer 4A including the drain-side overhang portion 4a by the drain-side hydrogen-terminated layer 8A. Thereby, the on-current of the FET 100A flows from the source electrode 6A to the drain electrode 7A.

The holes H move inside the non-doped diamond layer 4A without flowing inside the silicon-terminated layer 5A.

Since there is an energy barrier of approximately 0.8 eV to 1.6 eV between the silicon oxide film 3A and the non-doped diamond layer 4A, the holes H move along the silicon-terminated layer 5A while remaining inside the non-doped diamond layer 4A.

(Producing Method)

Figure 3:
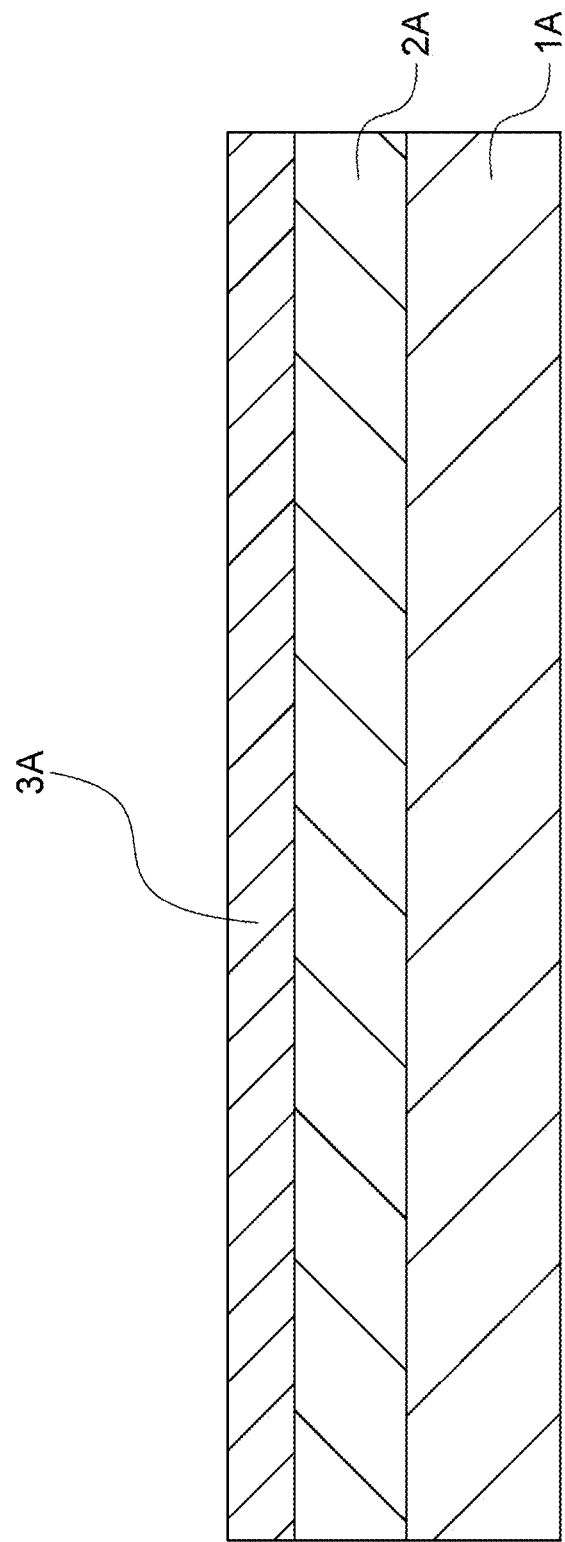
FIG. 3 is a cross-sectional view showing a method for producing the FET according to the first embodiment of the invention in a stepwise way, and is a cross-sectional view showing a stage when a silicon oxide film is formed.

Next, a method for producing the FET 100A according to the first embodiment will be described. First, as shown in FIG. 3, the non-doped diamond layer 2A (hereinafter also referred to as the diamond layer 2A) is formed on a surface of the diamond substrate 1A by epitaxial growth with a thickness of, for example, 200 nm or larger and 5 µm or smaller by a microwave chemical vapor deposition (CVD) method. Next, the silicon oxide film 3A having a thickness of, for example, 250 nm is formed on a surface of the non-doped diamond layer 2A by a plasma CVD method.

Subsequently, a photoresist mask is formed on the silicon oxide film 3A. A general photolithography method may be used for the photoresist mask. Next, the silicon oxide film 3A in a region not covered with the photoresist mask is selectively etched and removed by a reactive ion etching (RIE) method, and then a photoresist is removed. Through these steps, a region where the silicon oxide film 3A is formed on the non-doped diamond layer 2A and regions where the silicon oxide film 3A is removed and the non-doped diamond layer 2A is exposed are formed on the diamond substrate 1A.

Figure 4:
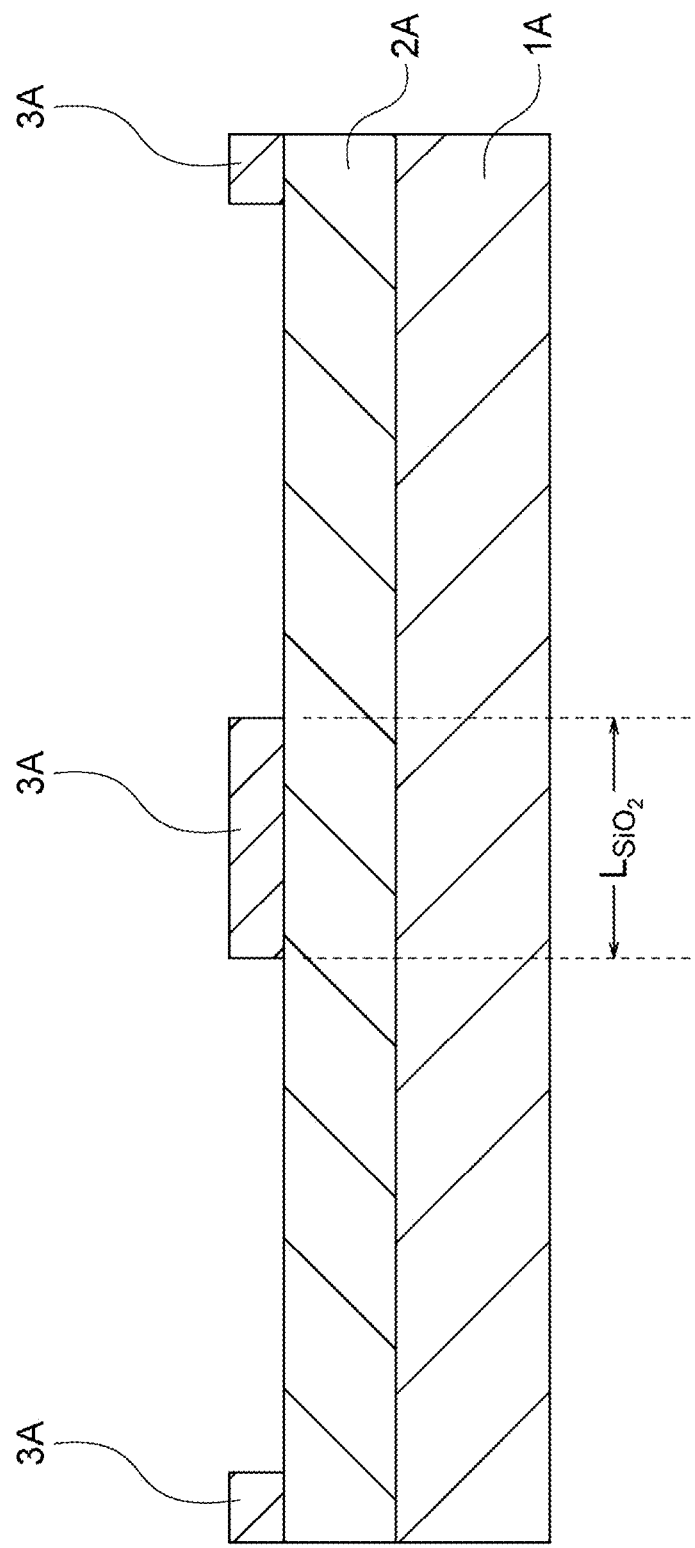
FIG. 4 is a cross-sectional view showing the method for producing the FET according to the first embodiment of the invention in the stepwise way, and is a cross-sectional view showing a stage when the silicon oxide film is etched.
Figure 12:
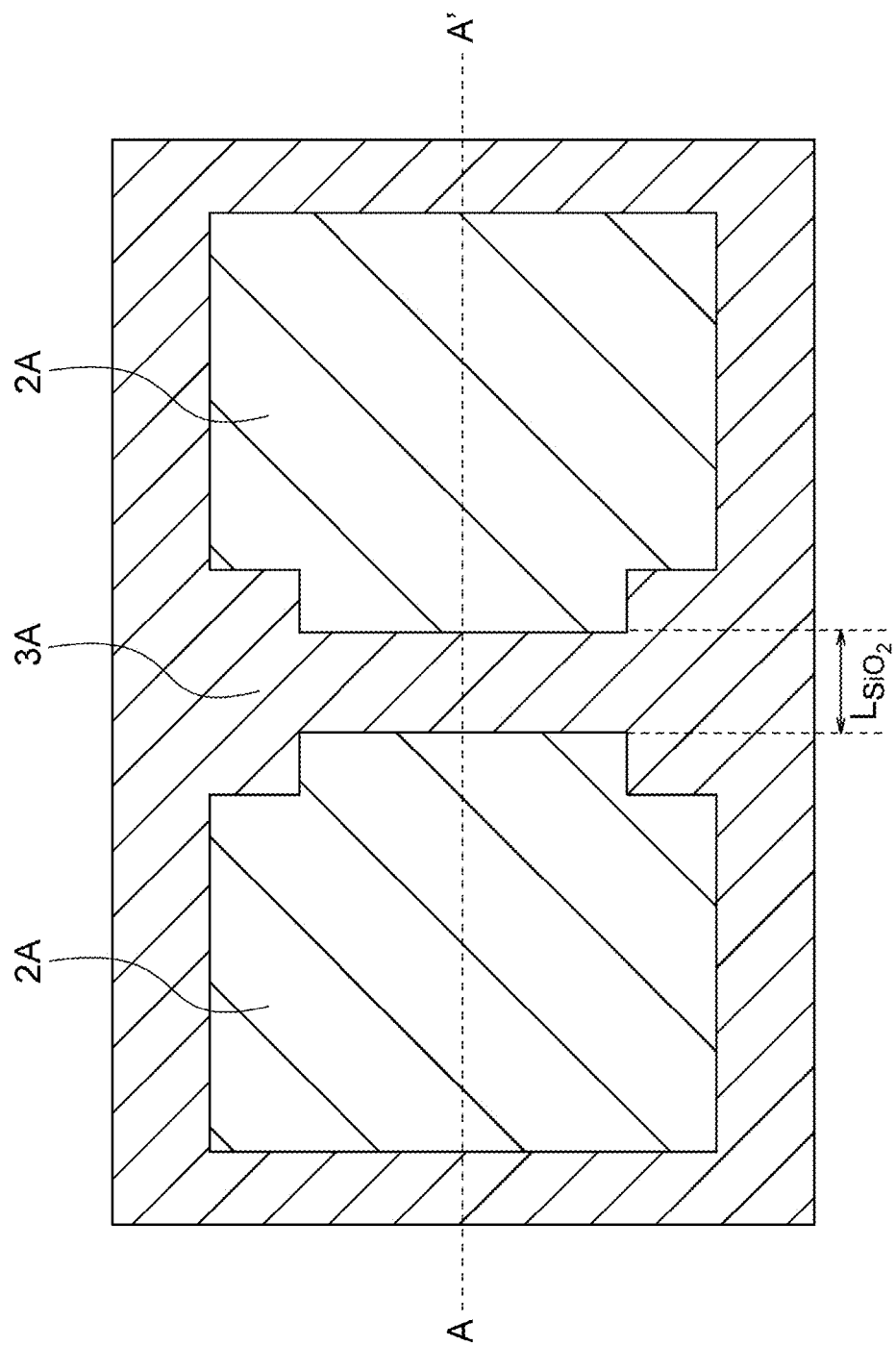
FIG. 12 is a plan view showing the method for producing the FET according to the first embodiment of the invention in a stepwise way, and is a plan view showing the stage when the silicon oxide film is etched.

A cross-sectional view at this stage is shown in FIG. 4, and a plan view is shown in FIG. 12. The cross-sectional view in FIG. 4 shows a cross section at a position of A-A' in the plan view in FIG. 12 (cross-sectional views to be described below are also cross-sectional views at a position of A-A' in the corresponding plan views). In FIGS. 4 and 12, a lateral width of the silicon oxide film 3A located at a center corresponds to the gate length $L_{SiO2}$ of the FET 100A.

Next, the non-doped diamond layers 4A are formed on the exposed non-doped diamond layer 2A by selective epitaxial growth by a high-temperature plasma treatment in a reducing atmosphere using a CVD device, using the silicon oxide film 3A formed by the etching treatment as a mask. A thickness of the non-doped diamond layer 4A is, for example, 300 nm.

As conditions for the selective epitaxial growth of the non-doped diamond layers 4A, for example, the selective epitaxial growth is preferably performed by discharging plasma at a growth temperature of 800° C. or higher in a reducing atmosphere containing 90% or higher and 99.9% or lower of hydrogen and 0.1% or higher and 10% or lower of methane.

The selective epitaxial growth of the non-doped diamond layers 4A is homo-epitaxial growth, in which a growth layer is epitaxially grown on the same material. In the present embodiment, the non-doped diamond layers 4A as the growth layer are selectively epitaxially grown on the exposed non-doped diamond layer 2A, and are not grown on the silicon oxide film 3A.

The selective epitaxial growth of the non-doped diamond layers 4A starts from the exposed surface of the non-doped diamond layer 2A, and then proceeds upward. As described above, in the present embodiment, the thickness of the silicon oxide film 3A is 250 nm, and the thickness of the diamond layer 4A is 300 nm. Therefore, the non-doped diamond layer 4A gets over an upper end portion of the silicon oxide film 3A to form the overhang portion 4a having an overhang shape covering a part of an upper surface of the silicon oxide film 3A (FIG. 5).

A height direction of the overhang portion 4a, that is, a thickness of the diamond layer 4A getting over the upper surface of the silicon oxide film 3A is approximately 50 nm corresponding to a difference value between 300 nm, which is the thickness of the non-doped diamond layer 4A, and 250 nm, which is the thickness of the silicon oxide film 3A. A length of an overhang of the overhang portion 4a, that is, a length of the non-doped diamond layer 4A getting over the surface of the silicon oxide film 3A is also approximately 50 nm as in the height direction. This is because, as a characteristic of the selective epitaxial growth, when there is no shield (in this case, the silicon oxide film 3A), the growth proceeds substantially uniformly in an upward direction and a horizontal direction.

Figure 5:
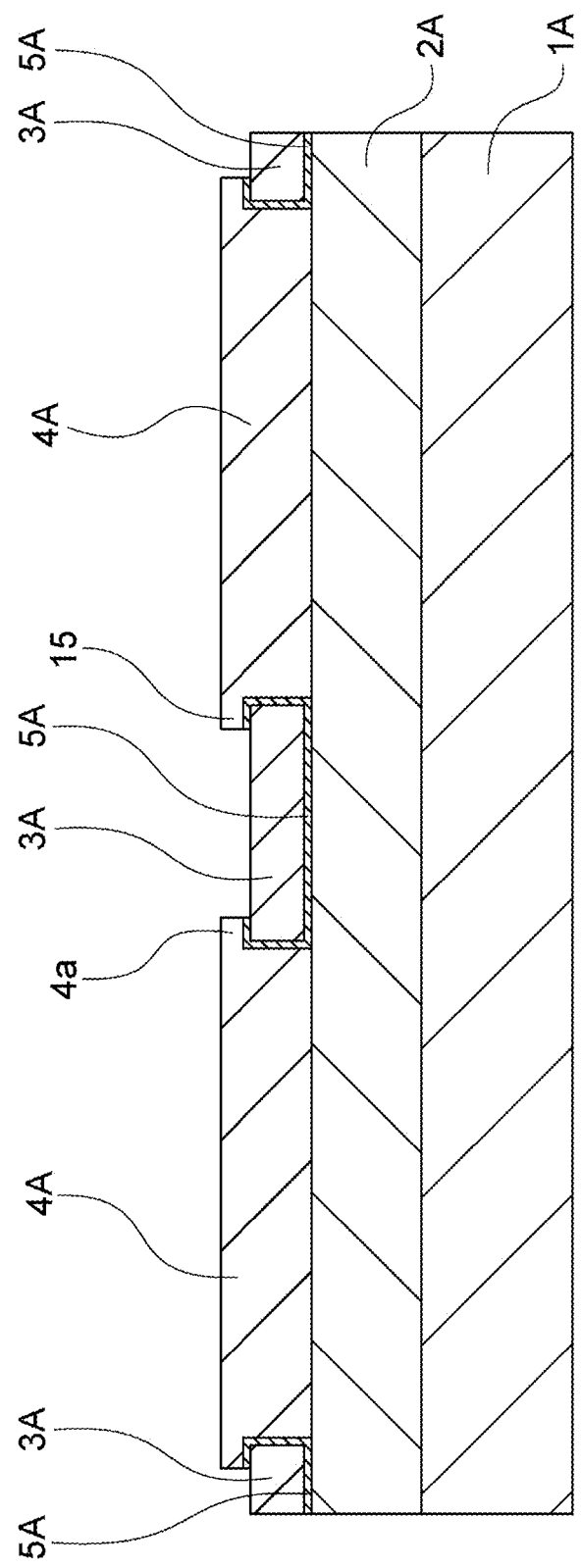
FIG. 5 is a cross-sectional view showing the method for producing the FET according to the first embodiment of the invention in the stepwise way, and is a cross-sectional view showing a stage when a silicon-terminated layer is formed.
Figure 13:
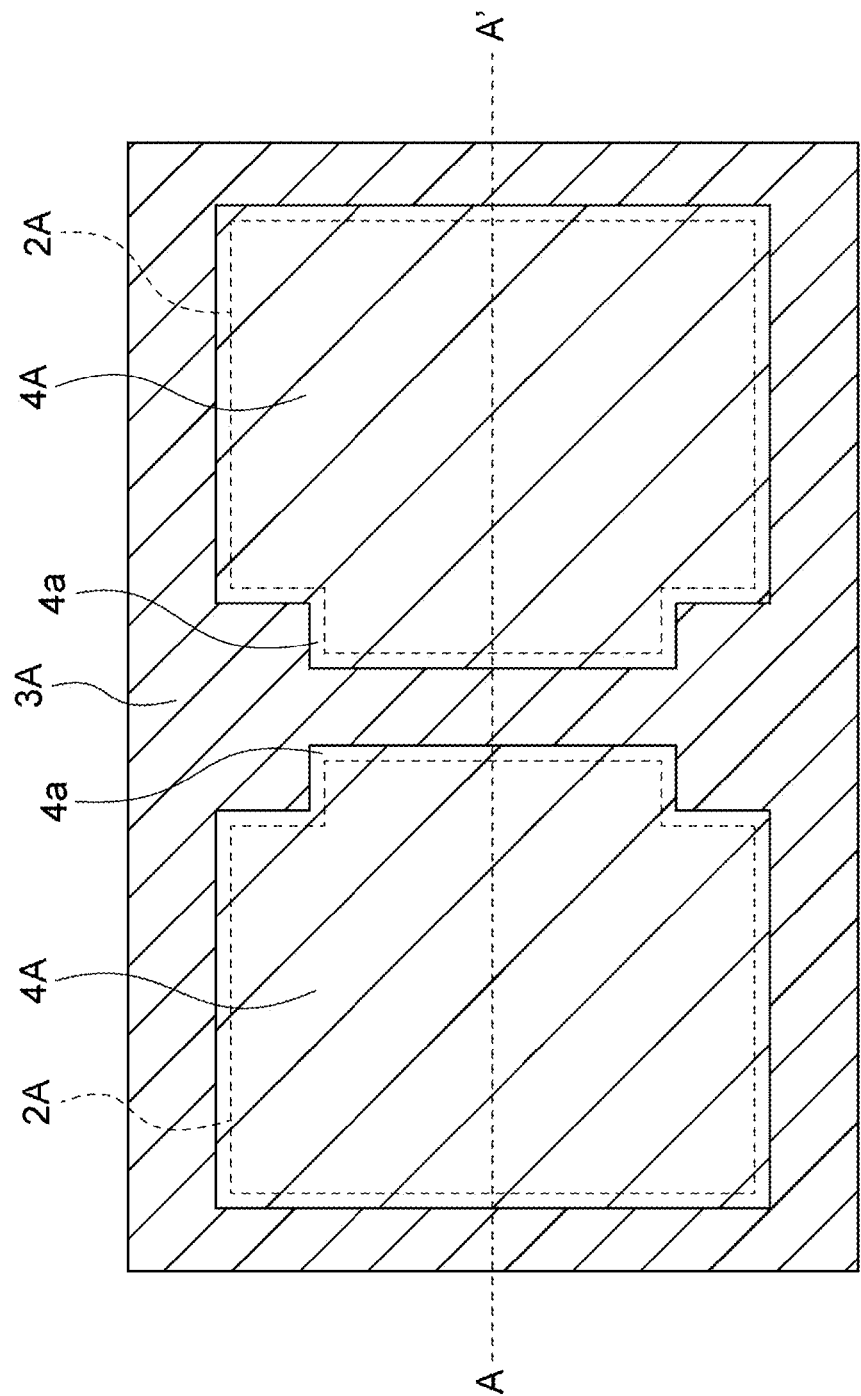
FIG. 13 is a plan view showing the method for producing the FET according to the first embodiment of the invention in the stepwise way, and is a plan view showing the stage when the silicon-terminated layer is formed.

As described above, a cross-sectional view after the non-doped diamond layers 4A are formed is shown in FIG. 5, and a plan view is shown in FIG. 13. In the plan view in FIG. 13, regions where the non-doped diamond layer 2A is exposed before the formation of the non-doped diamond layers 4A are indicated by dotted lines, and outer peripheral portions of the non-doped diamond layers 4A including the overhang portions 4a are indicated by solid lines. The non-doped diamond layer 4A including the overhang portion 4a has a shape expanded by the length of the overhang portion 4a out of the region where the non-doped diamond layer 2A is exposed.

The silicon-terminated layer 5A is formed at an interface between the non-doped diamond layer 2A and the silicon oxide film 3A and at interfaces between the non-doped diamond layers 4A and the silicon oxide film 3A during the selective epitaxial growth of the non-doped diamond layers 4A. More specifically, as shown in FIG. 5, the silicon-terminated layer 5A is formed at an interface between the surface of the non-doped diamond layer 2A and a bottom surface of the silicon oxide film 3A, at an interface between a side surface of the source-side and drain-side non-doped diamond layer 4A and each of both side surfaces of the silicon oxide film 3A, and at an interface between a bottom surface of the overhang portion 4a of each of the source-side and drain-side non-doped diamond layers 4A and a part of the upper surface of the silicon oxide film 3A.

Next, a photoresist having openings only in regions for forming the source electrode 6A and the drain electrode 7A is formed on the non-doped diamond layers 4A and the silicon oxide film 3A by the photolithography method. Subsequently, a deposited film made of metals, for example, Ti, Pt (platinum), and Al, constituting each of the source electrode 6A and the drain electrode 7A is sequentially formed on the exposed non-doped diamond layers 4A and the photoresist mask by a sputtering method or a vapor deposition method. Respective thicknesses may be, for example, 20 nm for Ti, 30 nm for Pt, and 100 nm for Au. Subsequently, the photoresist and the metal deposited film formed on the photoresist are removed using an organic solvent such as acetone. As described above, the source electrode 6A is formed on the surface of the source-side non-doped diamond layer 4A, and the drain electrode 7A is formed on the surface of the drain-side non-doped diamond layer 4A by a lift-off process. A cross-sectional view at this stage after the photoresist is removed is shown in FIG. 6, and a plan view is shown in FIG. 14.

Figure 6:
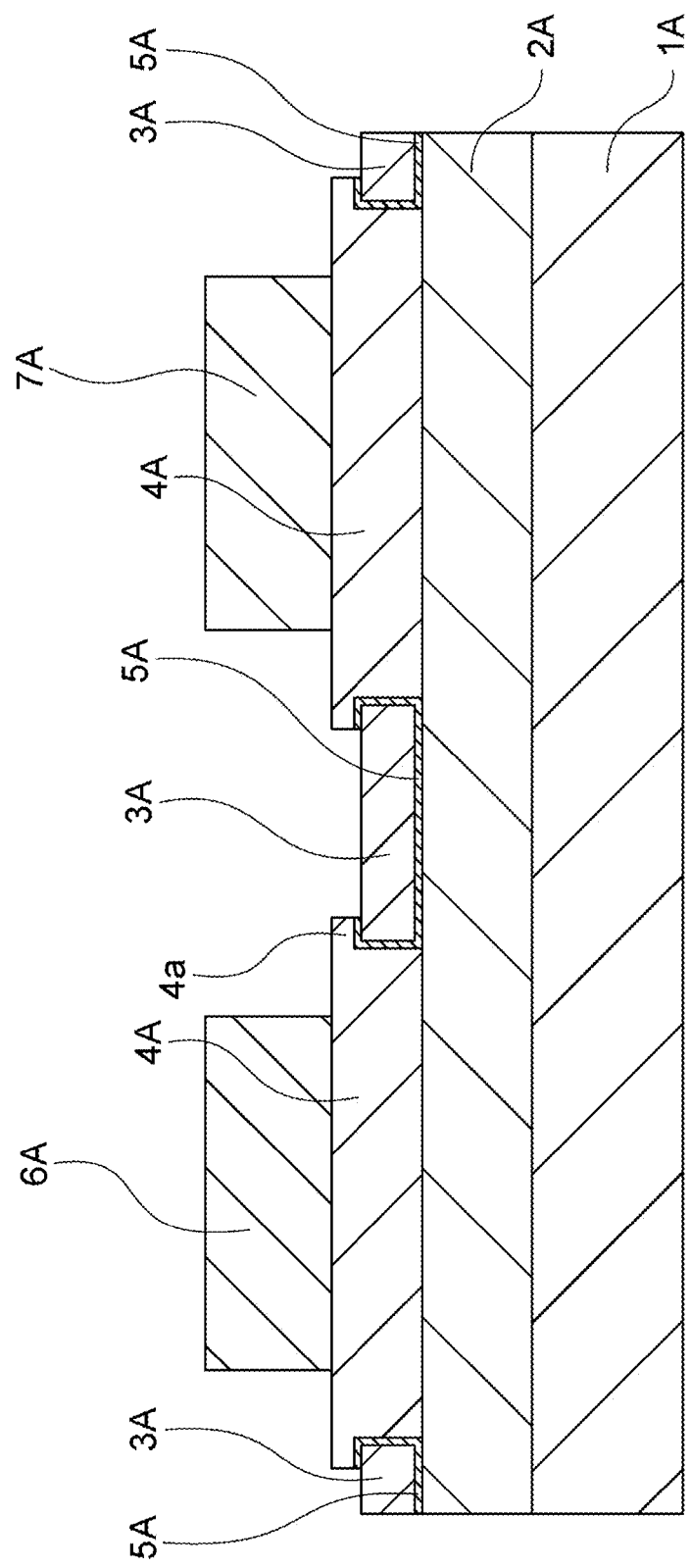
FIG. 6 is a cross-sectional view showing the method for producing the FET according to the first embodiment of the invention in the stepwise way, and is a cross-sectional view showing a stage when a source electrode and a drain electrode are formed.
Figure 14:
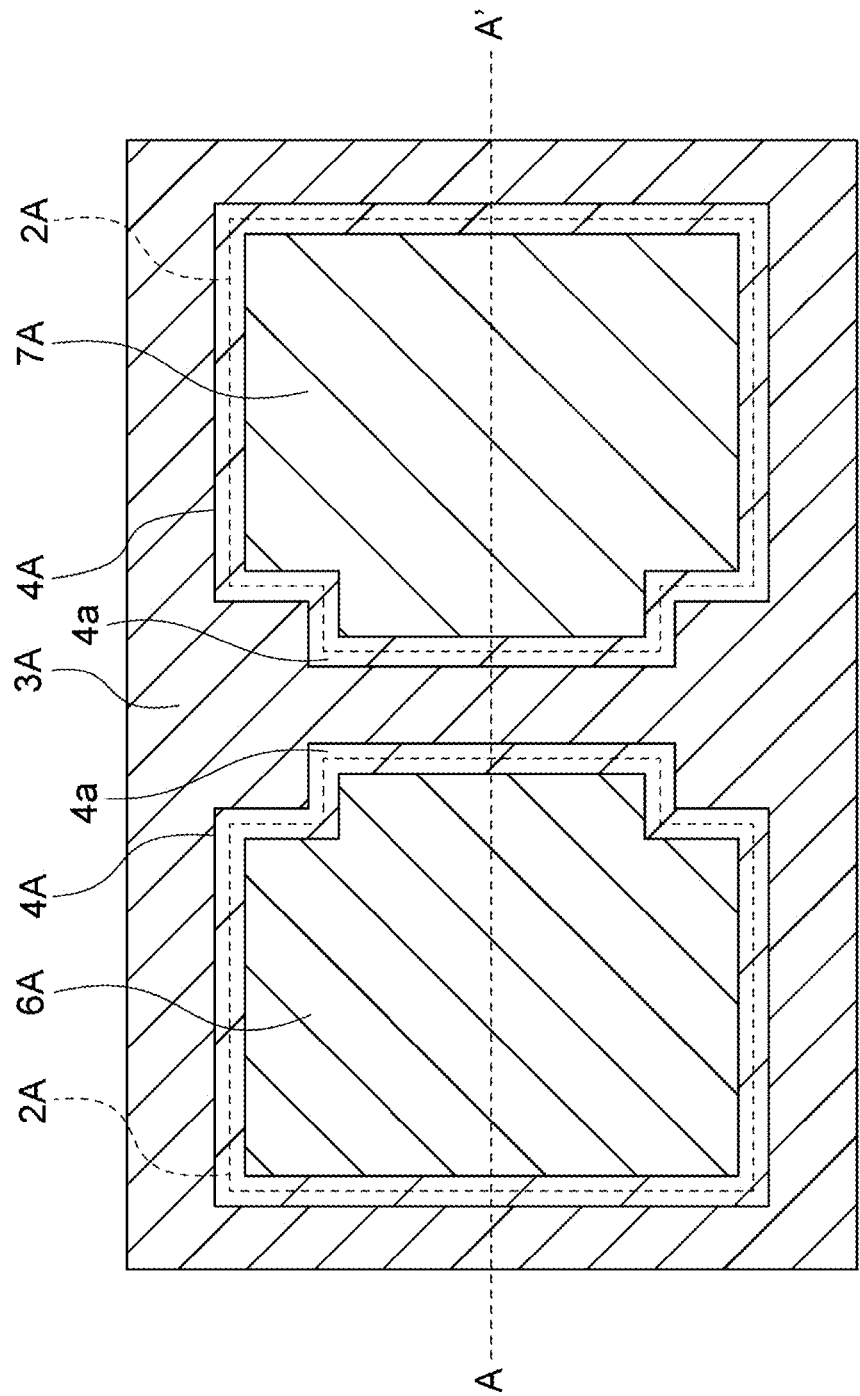
FIG. 14 is a plan view showing the method for producing the FET according to the first embodiment of the invention in the stepwise way, and is a plan view showing the stage when the source electrode and the drain electrode are formed.

As shown in FIGS. 6 and 14, the predetermined intervals, for example, 5 µm, are provided between the source electrode 6A and the end portion of the source-side non-doped diamond layer 4A not including the overhang portion 4a, and between the drain electrode 7A and the end portion of the drain-side non-doped diamond layer 4A not including the overhang portion 4a, respectively. Therefore, when the gate length $L_{SiO2}$ corresponding to the lateral width of the silicon oxide film 3A is 6 µm, the interval $L_{SD}$ between the source electrode 6A and the drain electrode 7A is 16 µm.

Next, a carbide treatment is performed to turn the Ti layer into TiC by an annealing treatment. The annealing treatment is a treatment of heating the diamond substrate 1A for a predetermined time in a low-pressure atmosphere into which hydrogen gas is introduced, and then rapidly cooling the diamond substrate 1A. Thereby, a carbide layer made of TiC (not shown) is formed between the Ti layer and each of the source-side and drain-side non-doped diamond layers 4A, and low-resistance ohmic contact is formed between the source electrode 6A and the non-doped diamond layer 4A and between the drain electrode 7A and the non-doped diamond layer 4A.

Figure 7:
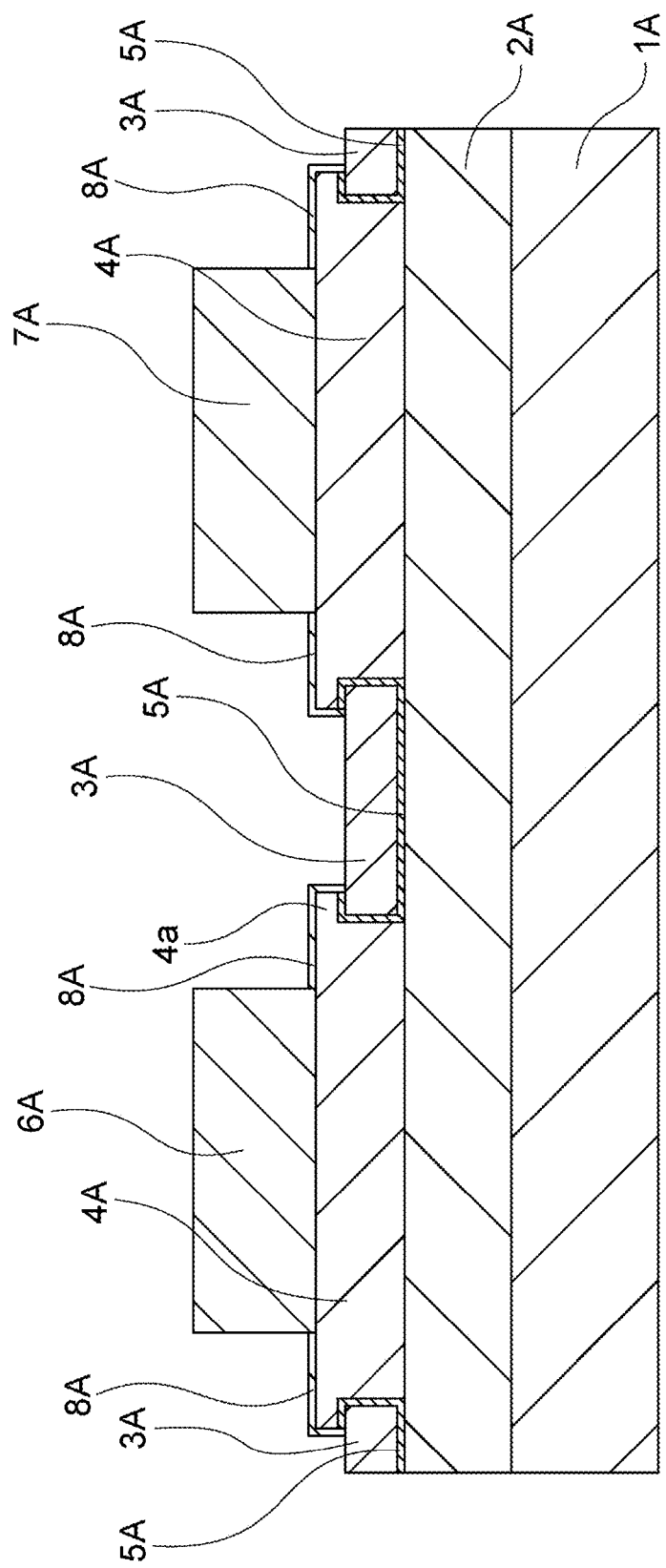
FIG. 7 is a cross-sectional view showing the method for producing the FET according to the first embodiment of the invention in the stepwise way, and is a cross-sectional view showing a stage when a hydrogen-terminated layer is formed.
Figure 15:
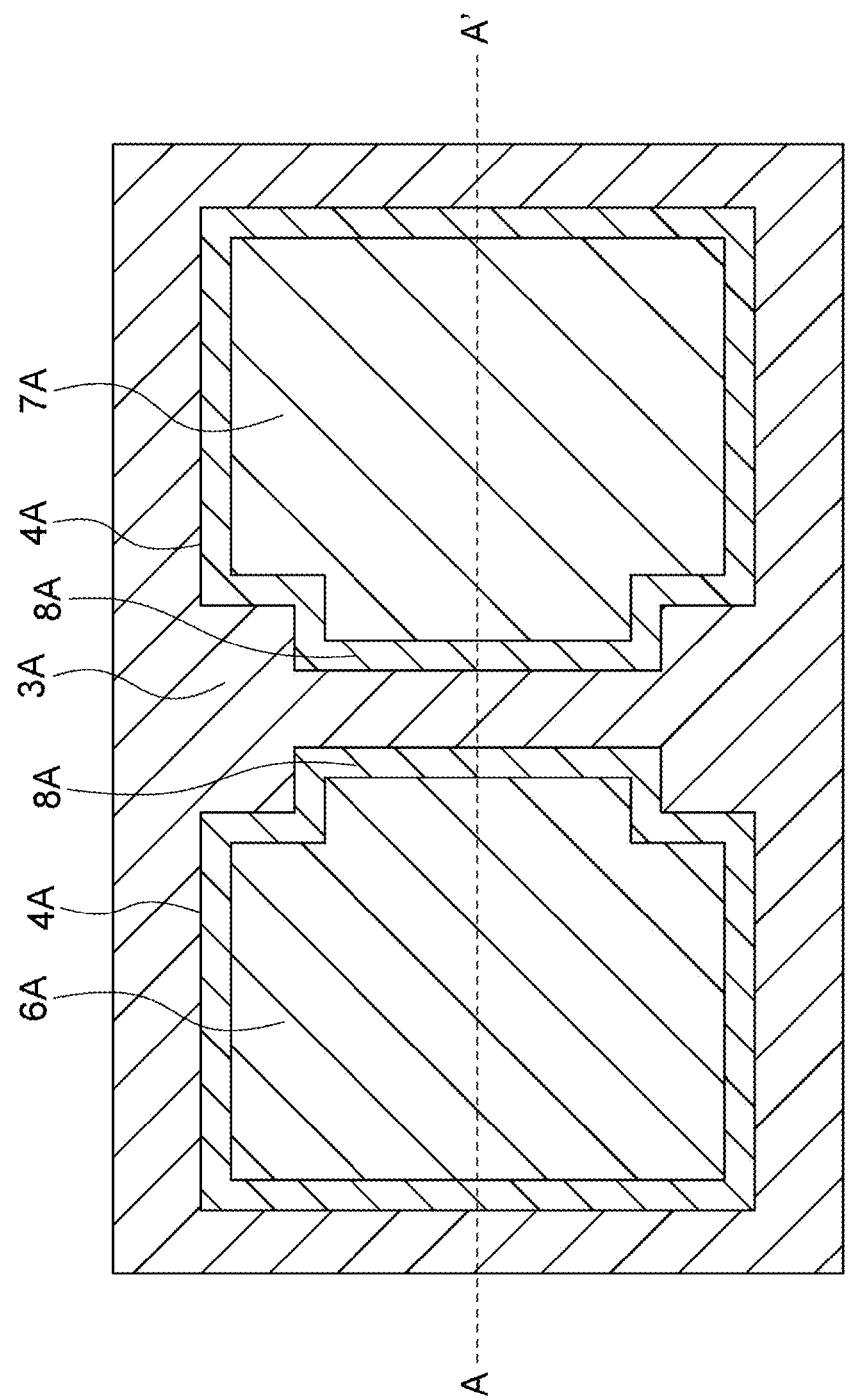
FIG. 15 is a plan view showing the method for producing the FET according to the first embodiment of the invention in the stepwise way, and is a plan view showing the stage when the hydrogen-terminated layer is formed.

Subsequently, the diamond substrate 1A is exposed to hydrogen plasma while being heated. Thereby, C atoms on the exposed surface of the non-doped diamond layers 4A react with H atoms in the hydrogen plasma to form the hydrogen-terminated layer 8A made of the C—H bonds. A cross-sectional view at this stage is shown in FIG. 7, and a plan view is shown in FIG. 15.

Since the non-doped diamond layer 2A in a region covered with the silicon oxide film 3A is not exposed to the hydrogen plasma, the non-doped diamond layer 2A is not hydrogen-terminated. Similarly, the non-doped diamond layer 4A in a region covered with each of the source electrode 6A and the drain electrode 7A is not hydrogen-terminated.

As described above, the selective epitaxial growth of the non-doped diamond layers 4A is performed in the reducing atmosphere containing a large amount of hydrogen. Therefore, when the source-side and drain-side diamond layers 4A are sufficiently hydrogen-terminated during the selective epitaxial growth, the above-described hydrogen plasma irradiation step can be omitted.

Figure 8:
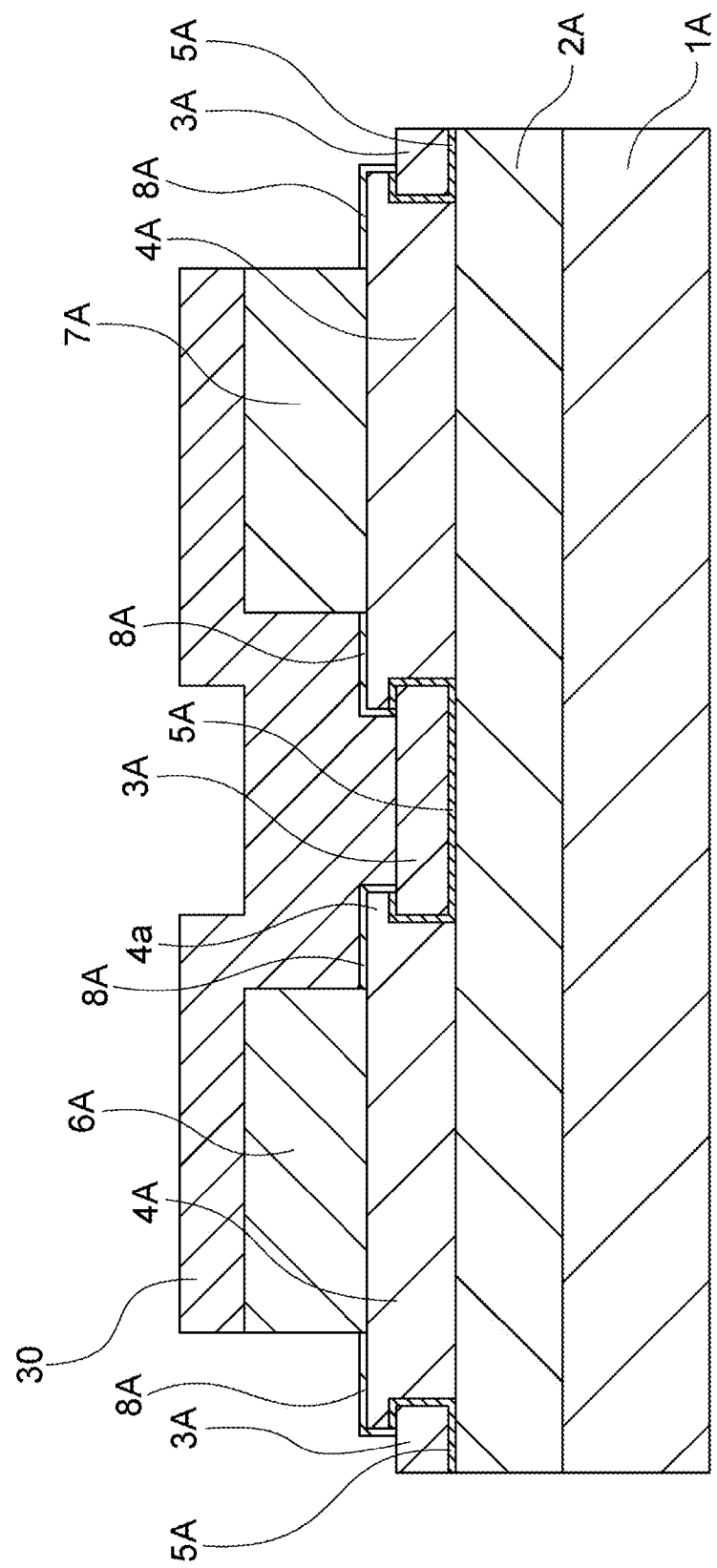
FIG. 8 is a cross-sectional view showing the method for producing the FET according to the first embodiment of the invention in the stepwise way, and is a cross-sectional view showing a stage when a photoresist mask is formed.
Figure 16:
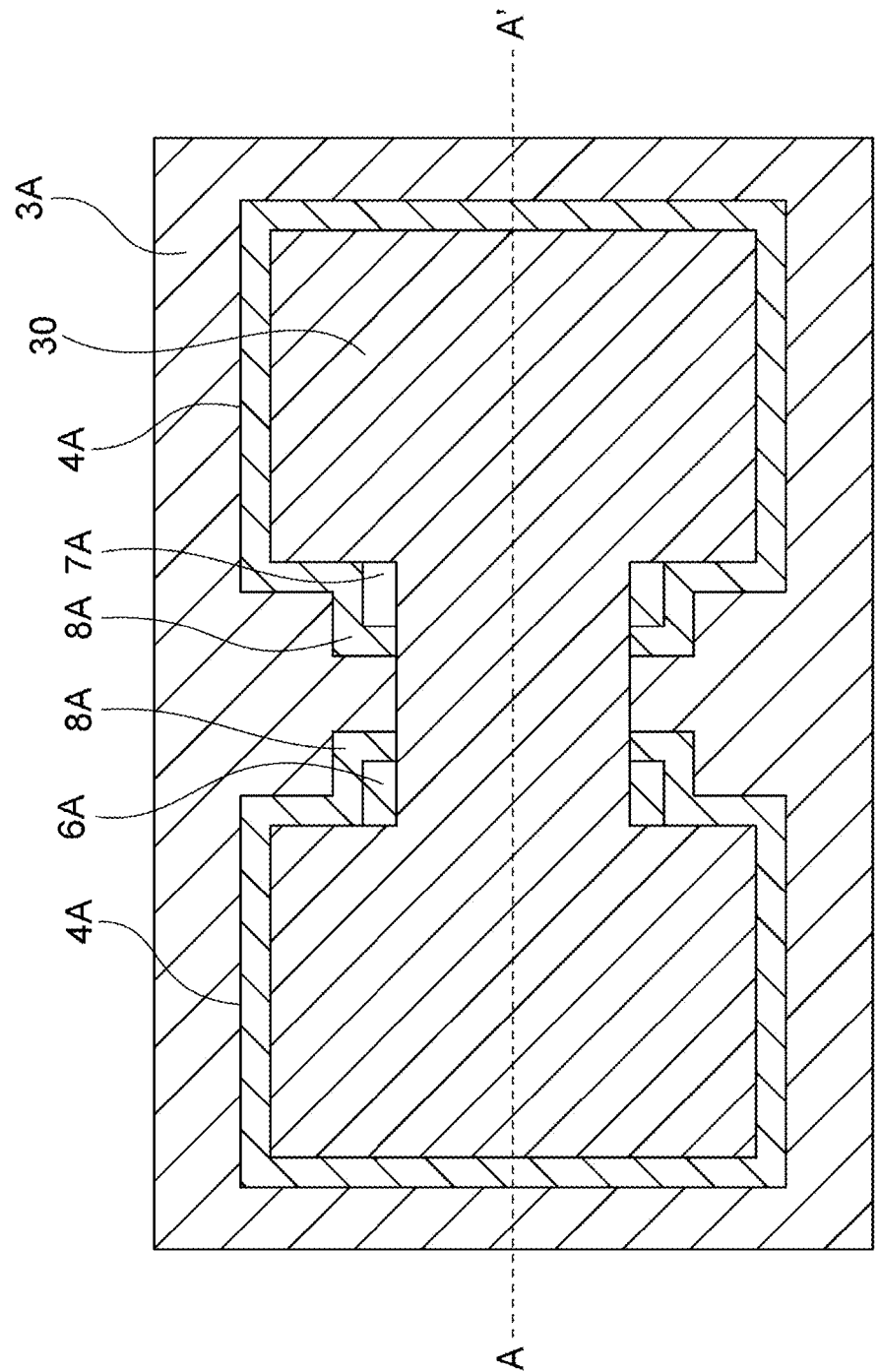
FIG. 16 is a plan view showing the method for producing the FET according to the first embodiment of the invention in the stepwise way, and is a plan view showing the stage when the photoresist mask is formed.

Subsequently, a photoresist 30 is formed by the photolithography method. A cross-sectional view at this stage is shown in FIG. 8, and a plan view is shown in FIG. 16. The photoresist 30 is formed so as to cover a region serving as the channel portion of the FET 100A and almost all regions of the source electrode 6A and the drain electrode 7A. For ease of explanation, the photoresist 30 is formed up to end portions of the source electrode 6A and the drain electrode 7A in FIGS. 8 and 16. However, in consideration of an alignment margin in a photolithography step, the photoresist 30 may cover the source electrode 6A and the drain electrode 7A up to inside thereof by, for example, several µm, from the end portions thereof.

Figure 9:
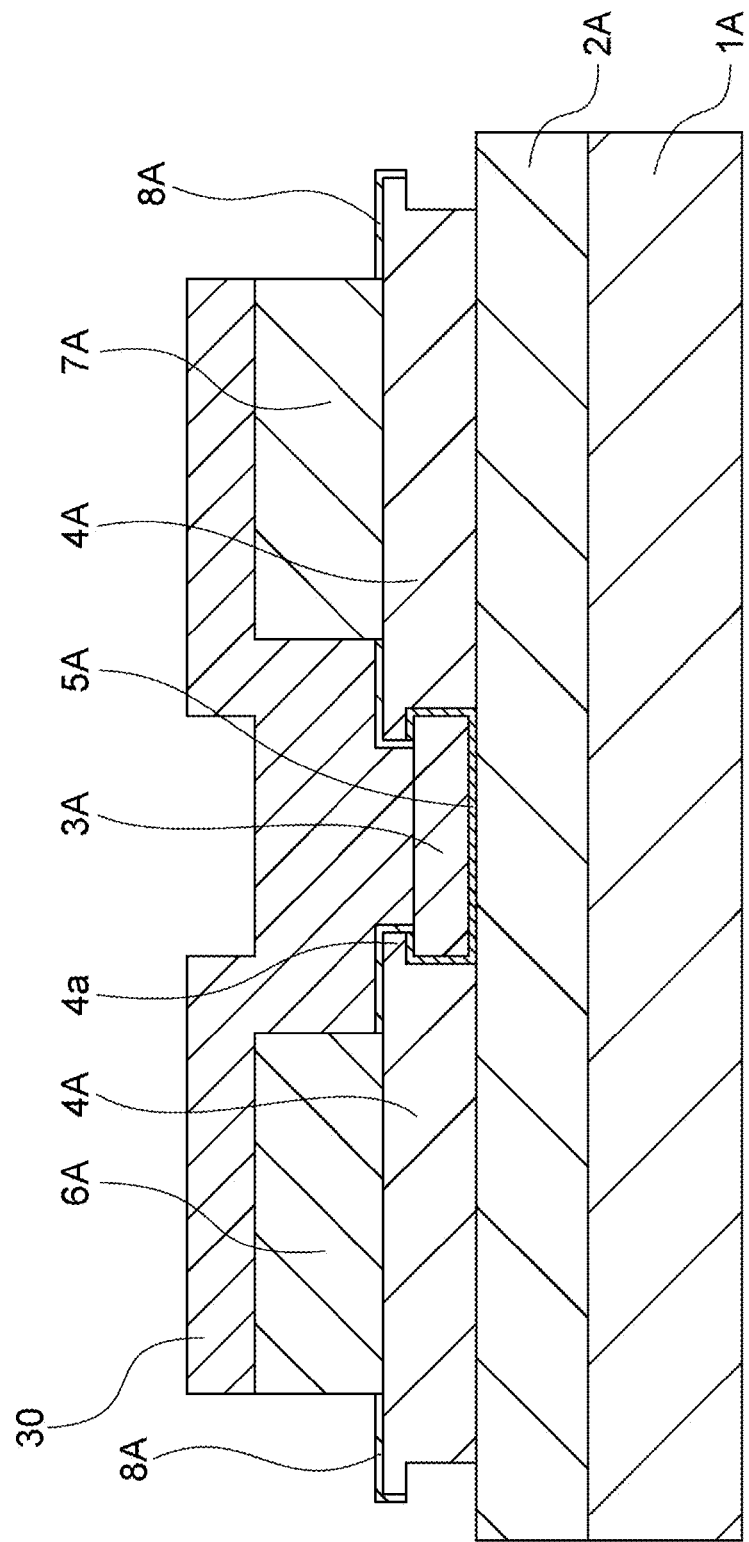
FIG. 9 is a cross-sectional view showing the method for producing the FET according to the first embodiment of the invention in the stepwise way, and is a cross-sectional view showing a stage when the silicon oxide film other than a channel portion is removed.
Figure 17:
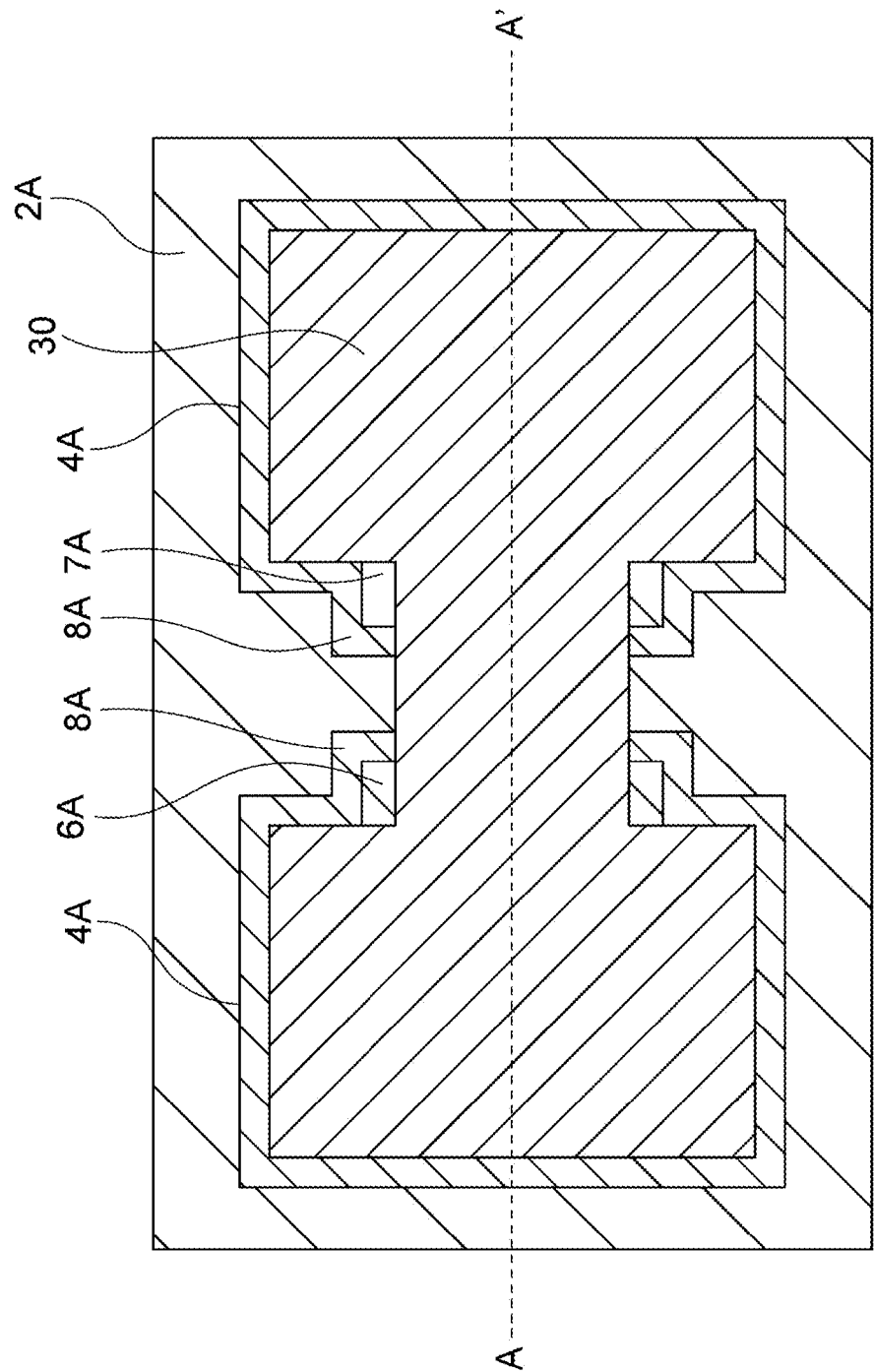
FIG. 17 is a plan view showing the method for producing the FET according to the first embodiment of the invention in the stepwise way, and is a plan view showing the stage when the silicon oxide film other than the channel portion is removed.

Next, the silicon oxide film 3A in the exposed region is selectively etched and removed by a RIE method using the photoresist 30 as a mask. A cross-sectional view at this stage is shown in FIG. 9, and a plan view is shown in FIG. 17. The silicon oxide film 3A remains in a partial region between the source-side diamond layer 4A and the drain-side diamond layer 4A, that is, only in the channel portion of the FET 100A, and is removed in the other region. The silicon-terminated layer 5A is also removed simultaneously by this etching. Therefore, as shown in FIG. 17, the non-doped diamond layer 2A is exposed in a region where the silicon oxide film 3A is removed.

Figure 10:
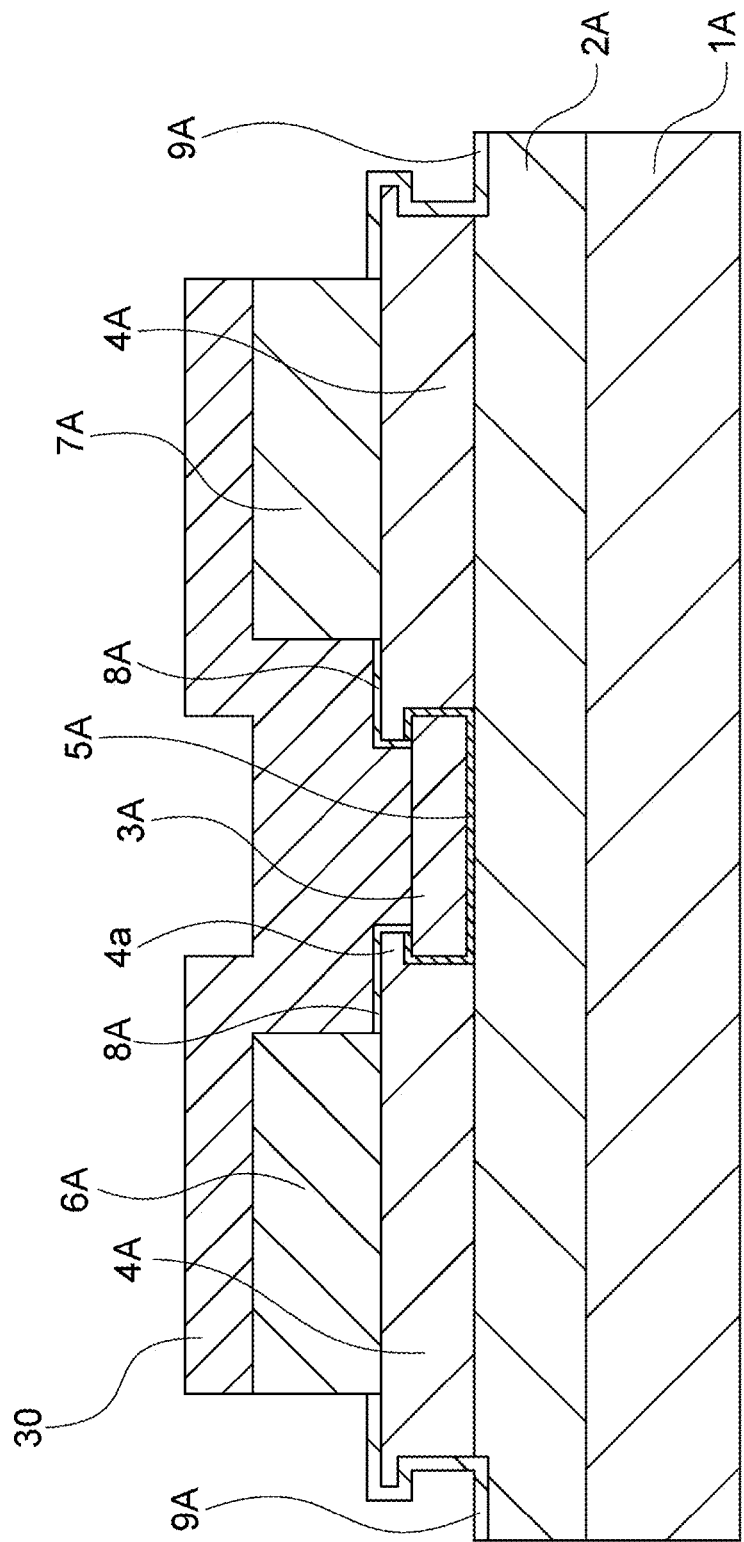
FIG. 10 is a cross-sectional view showing the method for producing the FET according to the first embodiment of the invention in the stepwise way, and is a cross-sectional view showing a stage when a device isolation layer is formed.
Figure 18:
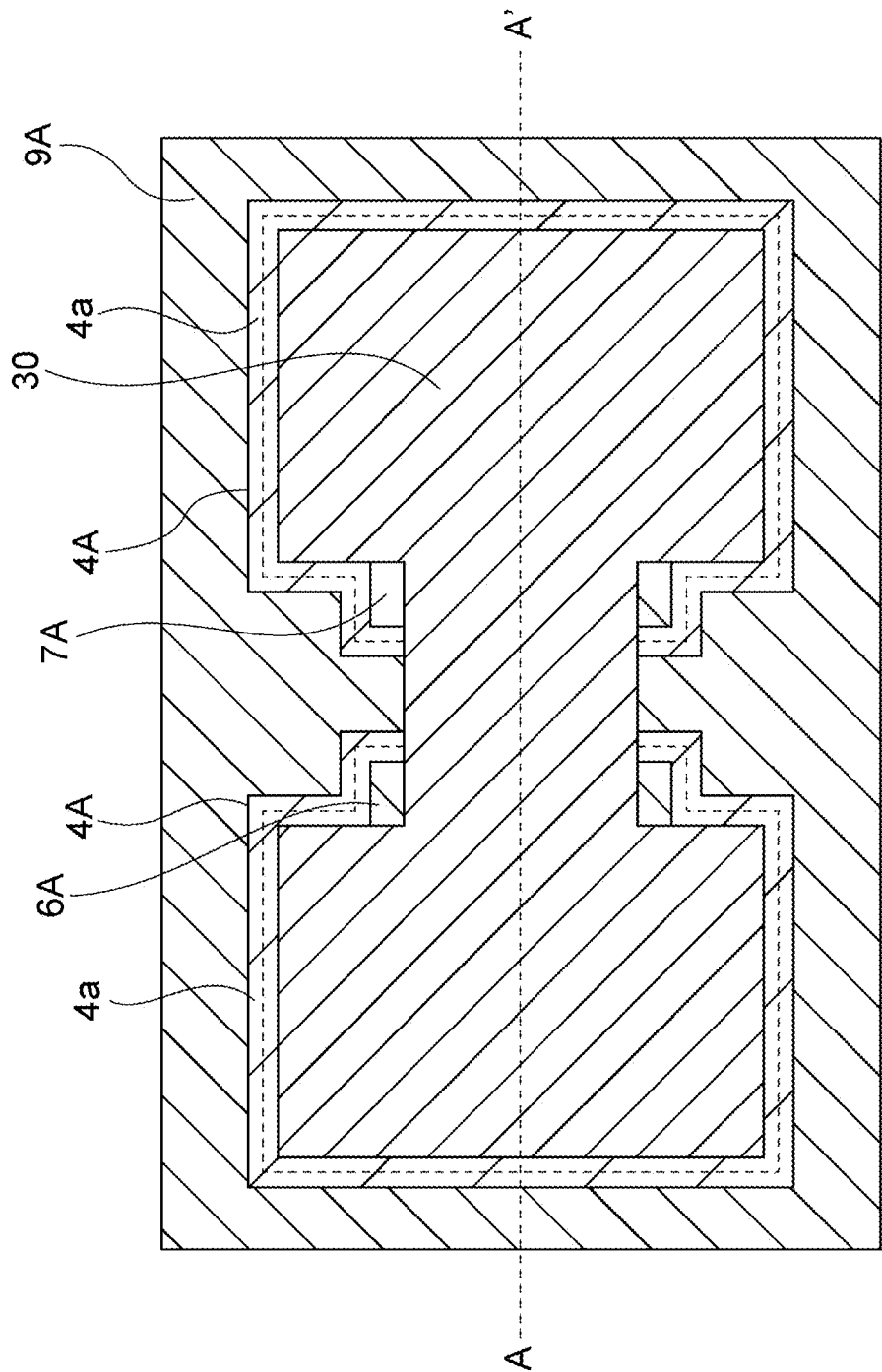
FIG. 18 is a plan view showing the method for producing the FET according to the first embodiment of the invention in the stepwise way, and is a plan view showing the stage when the device isolation layer is formed.

Subsequently, the surface of the diamond substrate 1A is exposed to oxygen plasma using the photoresist 30 as a mask. The surface of the non-doped diamond layer 2A exposed by oxygen plasma irradiation is oxygen-terminated to form the device isolation layer 9A. The hydrogen-terminated layers 8A on the surfaces of the non-doped diamond layers 4A in a region not covered with the photoresist 30 are changed from a hydrogen-terminated state to an oxygen-terminated state by the oxygen plasma, and are changed to the device isolation layer 9A. A cross-sectional view at this stage is shown in FIG. 10, and a plan view is shown in FIG. 18.

Figure 19:
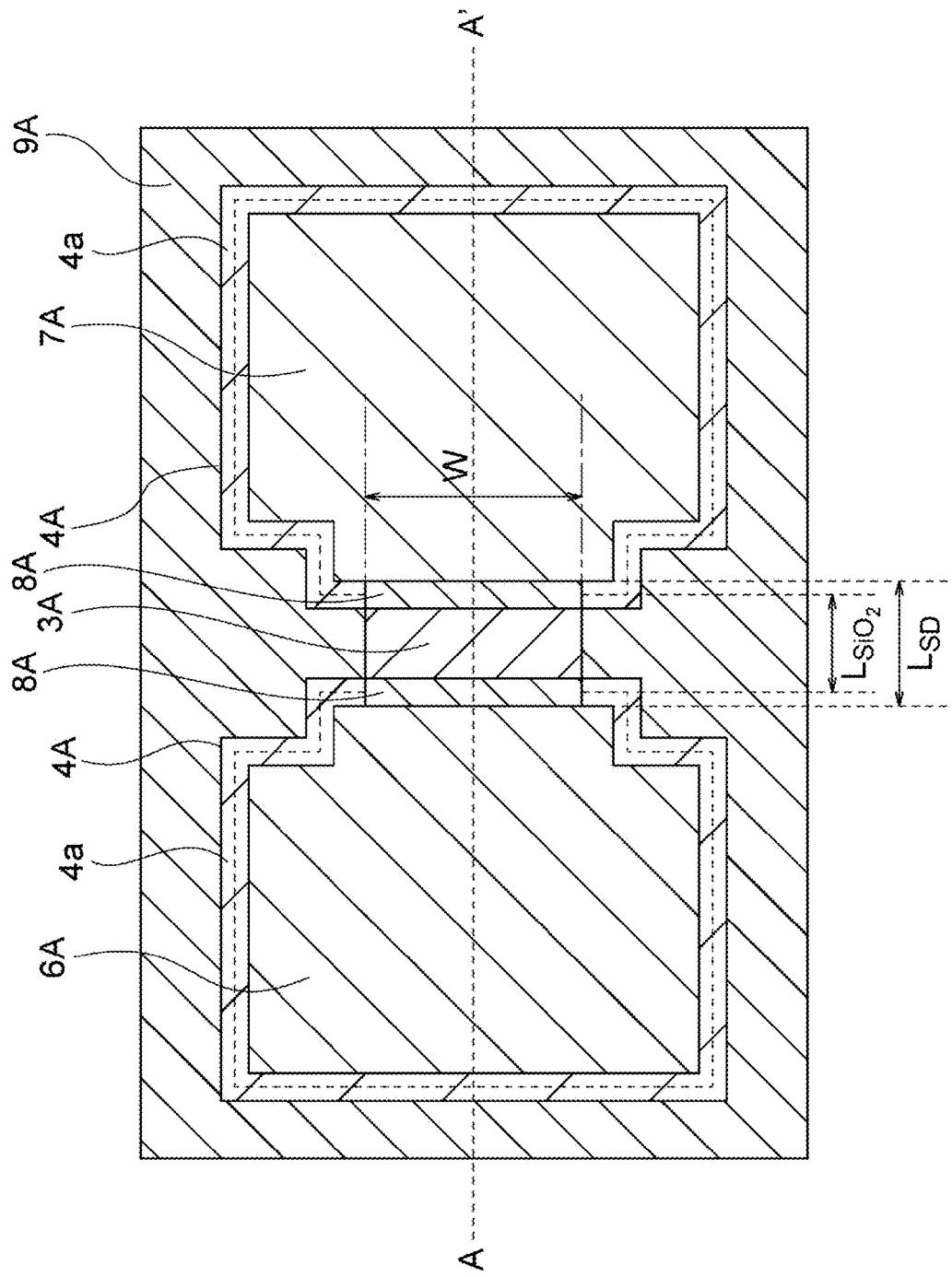
FIG. 19 is a plan view showing the method for producing the FET according to the first embodiment of the invention in the stepwise way, and is a plan view showing the stage when the photoresist mask is removed.

A plan view at this stage after the device isolation layer 9A is formed and the photoresist 30 is removed is shown in FIG. 19. A part of the upper surface of the silicon oxide film 3A is covered with the overhang portion 4a. The gate length $L_{SiO2}$ is the lateral width of the silicon oxide film 3A, and a gate width W is a longitudinal length of the silicon oxide film 3A. The hydrogen-terminated layers 8A are formed by a length of the gate width W on surfaces of the non-doped diamond layers 4A sandwiching the silicon oxide film 3A from both sides.

Figure 11:
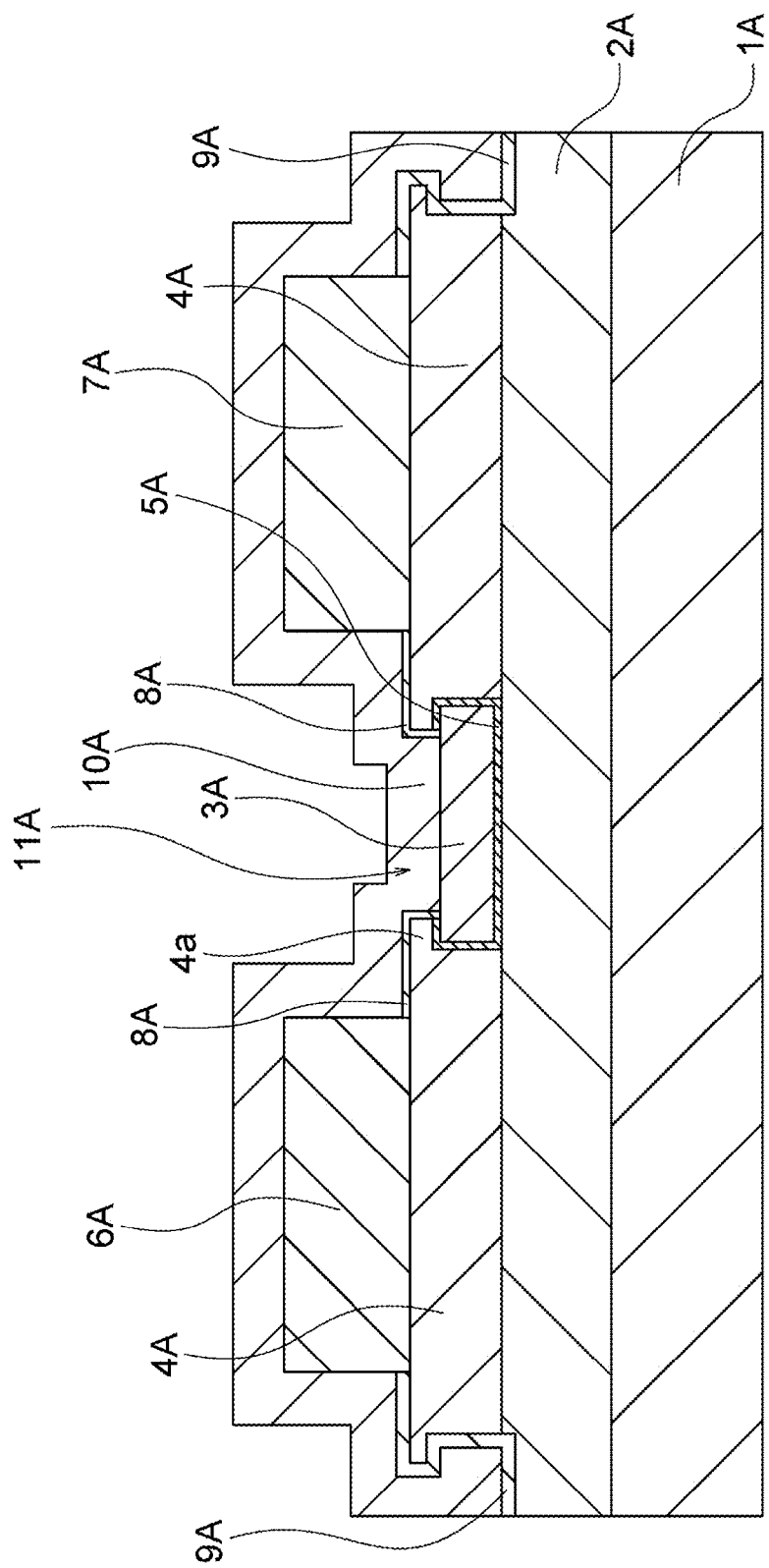
FIG. 11 is a cross-sectional view showing the method for producing the FET according to the first embodiment of the invention in the stepwise way, and is a cross-sectional view showing a stage when an insulating film is formed.

Subsequently, $Al_2O_3$ having a thickness of, for example, 100 nm is formed as the insulating film 10A by an atomic layer deposition (ALD) method. Thereby, the insulating film 10A is formed on surfaces of the silicon oxide film 3A, the non-doped diamond layers 4A, the source electrode 6A, the drain electrode 7A, and the device isolation layer 9A. As conditions of the ALD, trimethylaluminum (TMA) is used as a precursor of Al, water ($H_2O$) is used as an oxidant, and a temperature of the diamond substrate 1A is preferably 200° C. or higher, and more preferably 400° C. or higher. Details of the ALD method using water ($H_2O$) as the oxidant are described in a literature "Hiraiwa, 'Reliability of Atomic Layer Deposition $Al_2O_3$ Gate Insulating Film on GaN Substrate', Fourth Individual Discussion Text of Japan Society of Applied Physics/Advanced Power Semiconductor Subcommittee (2018 Jul. 30)". A cross-sectional view of the producing method at this stage is shown in FIG. 11.

The gate insulating film 11A of the FET 100A includes the silicon oxide film 3A and the insulating film 10A formed on the silicon oxide film 3A. The insulating film 10A on the non-doped diamond layers 4A functions as a passivation film for protecting the hydrogen-terminated layers 8A on the surface of the non-doped diamond layers 4A. The insulating film 10A on the source electrode 6A and the drain electrode 7A functions as an interlayer insulating film that electrically isolates the source electrode 6A and the drain electrode 7A from the gate electrode 12A.

As described above, the insulating film 10A on the silicon oxide film 3A may be omitted as necessary. That is, the gate insulating film 11A of the FET 100A may be formed of only the silicon oxide film 3A. In this case, for example, a photolithography step and an etching step for removing only the insulating film 10A on the silicon oxide film 3A may be appropriately added.

Subsequently, a photoresist having an opening only in a region for forming the gate electrode 12A is formed on the insulating film 10A by the photolithography method. Next, Al (aluminum) is formed on the insulating film 10A to a thickness of, for example, 100 nm or larger and 300 nm or smaller by, for example, an electron beam evaporation method or a resistance heating evaporation method. Next, the photoresist and Al formed on the photoresist are removed by an organic solvent such as acetone to form the gate electrode 12A. A cross-sectional view of the producing method at this stage is shown in FIG. 1.

In FIG. 1, a lateral width of the gate electrode 12A is formed to be wider than that of the silicon oxide film 3A, and may be formed to be equal to or smaller than the silicon oxide film 3A, for example. A material of the gate electrode 12A is not limited to Al, and Ni (nickel) or the like may be used, for example. The gate electrode 12A is extended in a direction perpendicular to a cross section of FIG. 1, and forms electrodes for bonding and contact of probe needles (not shown).

Metal wires may be further connected to the source electrode 6A and the drain electrode 7A as necessary. In this case, after openings (not shown) are formed in the insulating film 10A on the source electrode 6A and the drain electrode 7A by the photolithography method and a wet etching method, a metal wire (not shown) made of Al may be formed by using the lift-off process. The FET 100A is produced through steps described above. The step of forming the openings in the insulating film 10A on the source electrode 6A and the drain electrode 7A may be performed before the gate electrode 12A is formed.

<Functions and Effects>

The FET 100A according to the first embodiment constitutes a FET in which the silicon oxide film 3A on the surface of the non-doped diamond layer 2A and the gate electrode 12A are formed. There has been no case reported so far for an FET using a structure in which a silicon oxide film used as a gate insulating film is directly formed on a diamond layer via C—Si bonds.

In related art, a factor that hinders a stable operation of a diamond FET is an interface state generated in vicinity of an interface between a diamond substrate and a gate insulating film mainly made of $Al_2O_3$ due to C—O bonds formed on a surface of the diamond substrate. Since the FET 100A includes the silicon oxide film 3A containing the C—Si bonds on the surface of the non-doped diamond layer 2A, generation of an interface state due to the C—O bonds can be significantly reduced as compared with the related-art diamond FET. Therefore, it is possible to obtain a diamond FET for a power device that requires a high breakdown voltage and large current operation. Further, the FET 100A achieves normally-off characteristics, which is one of important issues in power devices.

In the present embodiment, the silicon-terminated layer 5A can be formed in a selective epitaxial growth step for the non-doped diamond layers 4A, and thus the silicon-terminated layer 5A can be formed without increasing the number of steps compared to the related art. There is no particular reason for separately providing a step of forming the silicon-terminated layer 5A in order to produce the FET 100A, but the step of forming the silicon-terminated layer 5A may be provided separately from the selective epitaxial growth step for the non-doped diamond layers 4A as necessary.

For example, when it is desired to change the conditions for the selective epitaxial growth of the non-doped diamond layers 4A, the high-temperature plasma treatment in the reducing atmosphere may be performed as the step of forming the silicon-terminated layer 5A at an appropriate stage after the selective epitaxial growth of the non-doped diamond layers 4A is completed.

For example, in a case where the selective epitaxial growth of the non-doped diamond layers 4A is not performed, or in a case of a FET having a structure in which the non-doped diamond layers 4A are not used, the high-temperature plasma treatment in the reducing atmosphere may be performed as the step of forming the silicon-terminated layer 5A at an appropriate stage after the silicon oxide film 3A is formed on the surface of the non-doped diamond layer 2A.

Second Embodiment

Figure 20:
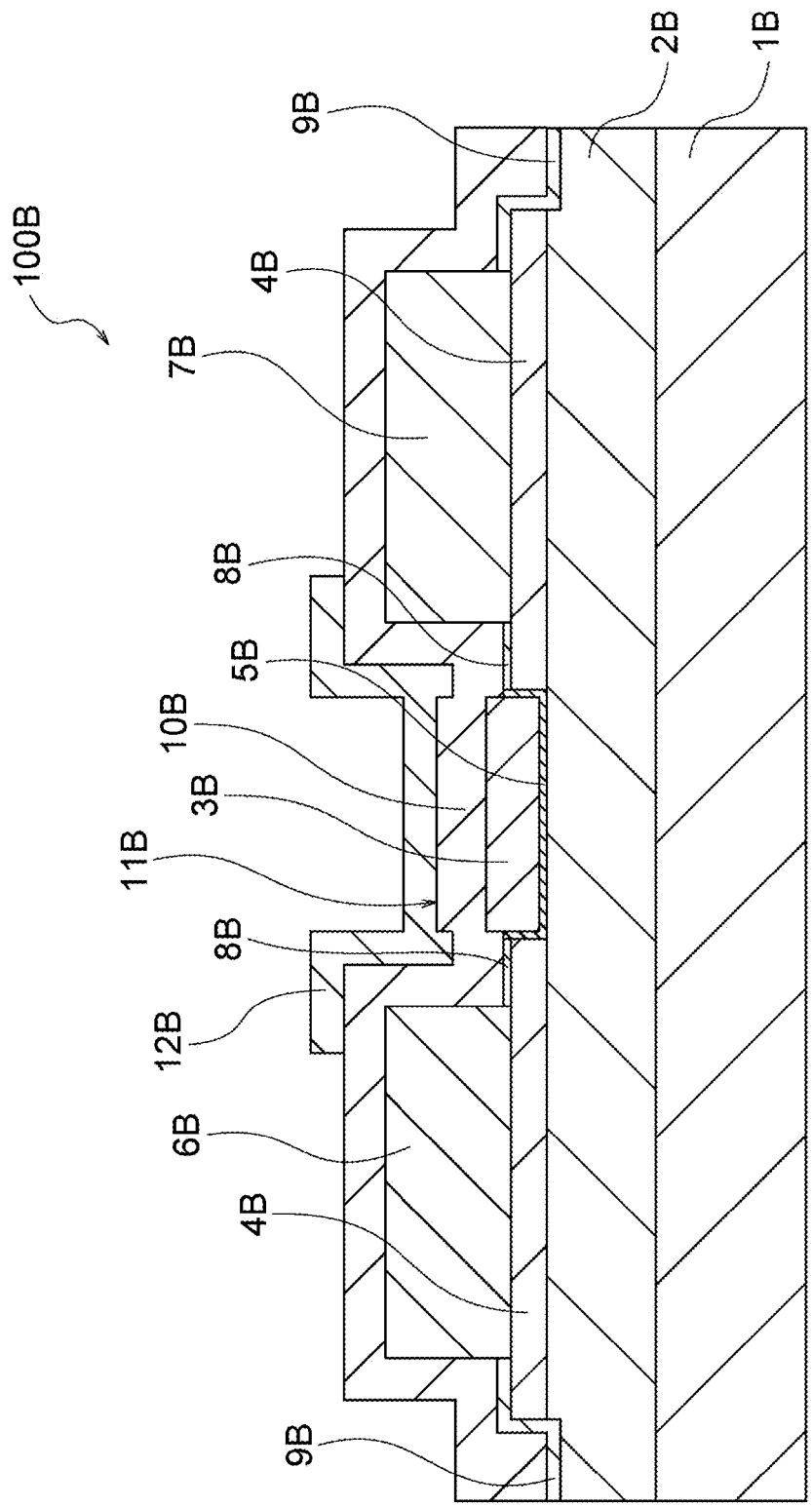
FIG. 20 is a cross-sectional view showing a configuration of a FET according to a second embodiment of the invention.

An overall configuration of a diamond field effect transistor 100B (hereinafter referred to as a FET 100B) according to a second embodiment of the invention will be described with reference to FIG. 20. FIG. 20 is a cross-sectional view showing a configuration of the FET 100B. Description common to that of the first embodiment may be omitted.

In FIG. 20, in the FET 100B according to the second embodiment, a non-doped diamond layer 2B that is epitaxially grown is formed on a diamond substrate 1B. A thickness of the non-doped diamond layer 2B is, for example, in a range of 200 nm or larger and 5 μm or smaller (in the following description, the non-doped diamond layer 2B may be referred to as the diamond layer 2B).

A silicon oxide film 3B is formed in a partial region on the diamond layer 2B. A thickness of the silicon oxide film 3B is, for example, 250 nm.

A pair of boron-doped diamond layers 4B are further formed on the diamond layer 2B so as to be separated from each other. One of the pair of boron-doped diamond layers 4B functions as a source region of the FET 100B, and the other thereof functions as a drain region. In the following description, one of the pair of boron-doped diamond layers 4B (left side in the drawing) is referred to as the source-side boron-doped diamond layer 4B, and the other thereof (right side in the drawing) is referred to as the drain-side boron-doped diamond layer 4B. Alternatively, the boron-doped diamond layer 4B may be referred to as the source-side diamond layer 4B or the drain-side diamond layer 4B. In particular, when a source side and a drain side are not distinguished from each other, the boron-doped diamond layer 4B is simply referred to as the boron-doped diamond layer 4B.

The source-side boron-doped diamond layer 4B is in contact with a source-side side surface of the silicon oxide film 3B, and the drain-side boron-doped diamond layer 4B is in contact with a drain-side side surface of the silicon oxide film 3B. The boron-doped diamond layers 4B are layers that are selectively epitaxially grown on the diamond layer 2B using the silicon oxide film 3B as a mask. A thickness of the boron-doped diamond layer 4B is, for example, 150 nm. Boron, which is a p-type impurity, is doped during the selective epitaxial growth.

In the present embodiment, a reason why the diamond layer 4B is doped with boron is to reduce a resistance of each of the source region and the drain region of the FET 100B, and an element to be doped may be another p-type impurity, for example, Al or Ga (gallium). The p-type impurity element may not be introduced during the selective epitaxial growth, and for example, after the diamond layer 4B is formed to be non-doped, the p-type impurity element may be introduced by another method such as ion implantation.

In the present embodiment, as shown in FIG. 20, a silicon-terminated layer 5B containing C—Si bonds is formed at an interface between the diamond layer 2B and the silicon oxide film 3B and at interfaces between the boron-doped diamond layers 4B and the silicon oxide film 3B. The silicon-terminated layer 5B may be a single layer, and preferably includes a plurality of layers. However, it is not necessary that all C atoms contained in the silicon-terminated layer 5B are bonded to Si atoms to form the C—Si bonds.

A source electrode 6B is formed on a surface of the source-side boron-doped diamond layer 4B, and a drain electrode 7B is formed on a surface of the drain-side boron-doped diamond layer 4B. Predetermined intervals are provided between the source electrode 6B and an end portion of the source-side boron-doped diamond layer 4B, and between the drain electrode 7B and an end portion of the drain-side boron-doped diamond layer 4B, respectively. Each of the source electrode 6B and the drain electrode 7B has a configuration in which a Ti layer, a Pt layer, and an Au layer are sequentially deposited to form ohmic contacts to the source-side and drain-side diamond layer 4B. A carbide layer made of TiC is formed between the Ti layer and the boron-doped diamond layer 4B. The Ti layer, the Pt layer, the Au layer, and the carbide layer are not shown in FIG. 20.

In the present embodiment, a hydrogen-terminated layer 8B is formed on a part of the surface of each of the boron-doped diamond layers 4B. Specifically, as shown in FIG. 20, the hydrogen-terminated layer 8B is formed in a region between an end portion of each of the source electrode 6B and the drain electrode 7B and the end portion of each of the boron-doped diamond layers 4B.

The hydrogen-terminated layer 8B induces a two-dimensional hole gas (2DHG) (not shown) inside each of the source-side and drain-side boron-doped diamond layers 4B directly below the hydrogen-terminated layer 8B, whereby a p-type conductive layer can be formed. The hydrogen-terminated layer 8B may be omitted.

An insulating film 10B is formed on the silicon oxide film 3B, the boron-doped diamond layers 4B, the source electrode 6B, and the drain electrode 7B. The insulating film 10B may be formed of, for example, $Al_2O_3$ (alumina), and a thickness thereof may be in a range of, for example, 100 nm or larger and 300 nm or smaller. The insulating film 10B may be another insulating film, for example, an aluminum silicate (AlSiO) film or a silicon nitride film (SixNy).

The insulating film 10B on the silicon oxide film 3B constitutes a gate insulating film 11B together with the silicon oxide film 3B. When the thickness of the silicon oxide film 3B is, for example, 250 nm as described above, a thickness of the gate insulating film 11B is, for example, in a range of 350 nm or larger and 550 nm or smaller.

Main characteristics of the FET 100B do not change depending on presence or absence of the insulating film 10B on the silicon oxide film 3A. This is because important characteristics are determined by the silicon oxide film 3B directly formed on a surface of the diamond layer 2B in a FET having a MOS-type structure such as the FET 100B. More specifically, the characteristics of the FET 100B greatly depend on the interface between the surface of the diamond layer 2B and the silicon oxide film 3B directly formed on the surface of the diamond layer 2B. Therefore, the insulating film 10B on the silicon oxide film 3A may be omitted as necessary. When the insulating film 10B on the silicon oxide film 3B is omitted, the gate insulating film 11B is formed of only the silicon oxide film 3B. Adjustment of an amount of change in the characteristics of the FET 100B, for example, adjustment of a threshold voltage when the gate insulating film 11B is formed of only the silicon oxide film 3B, can be performed by increasing the thickness of the silicon oxide film 3B.

The insulating film 10B on the boron-doped diamond layers 4B functions as a passivation film that protects surfaces thereof on the source side and the drain side, particularly the hydrogen-terminated layers 8B. The insulating film 10B on the source electrode 6B and the drain electrode 7B functions as an interlayer insulating film that insulates the source electrode 6B and the drain electrode 7B from a gate electrode 12B.

The gate electrode 12B is formed on the gate insulating film 11B with a thickness of, for example, approximately 100 nm using, for example, Al (aluminum). A gate length of the FET 100B is defined not by a width of the gate electrode 12B but by the width $L_{SiO2}$ of the silicon oxide film 3B on the diamond layer 2B. In the present embodiment, the interval between the source-side and drain-side boron-doped diamond layers 4B is defined as $L_{SD}$. In the present embodiment, since a width of the silicon oxide film 3B is the same as the interval between the source-side and drain-side boron-doped diamond layers 4B, $L_{SiO2}$ and $L_{SD}$ have the same value.

A device isolation layer 9B insulates a part of the surface of the diamond layer 2B and a part of the surface of the boron-doped diamond layer 4B in a region other than a channel portion of the FET 100B, and electrically isolates the two from each other. The device isolation layer 9B is formed by bonding O atoms to C atoms on the surface of the diamond layer 2B and the surface of each of the source-side and drain-side boron-doped diamond layers 4B to form C—O bonds.

Each of upper end portions of the source-side and drain-side boron-doped diamond layers 4B may have an overhang shape covering a part of an upper surface of the silicon oxide film 3B. In this case, the boron-doped diamond layer 4B may be formed to have a thickness of, for example, 300 nm, which is thicker than the silicon oxide film 3B.

(Operation Principle)

Next, an operation principle of the FET 100B will be described with reference to FIG. 21. Description common to that of the first embodiment may be omitted. In the FET 100B, the drain current $I_{DS}$ flowing from the source electrode 6B to the drain electrode 7B is controlled by the gate voltage $V_{GS}$ applied to the gate electrode 12B, and the FET 100B can be switched between ON and OFF. The FET 100B is a p-channel FET, and the drain current $I_{DS}$ is a hole current having a hole H as a carrier.

The FET 100B is an enhancement-type FET and achieves a normally-off operation. Even when the FET 100B is in an OFF state ($V_{GS}$=0 V), the two-dimensional hole gas is generated by the C—H bonds of the hydrogen-terminated layer 8B, directly below each of the surfaces of the source-side and drain-side boron-doped diamond layers 4B on which the hydrogen-terminated layer 8B is formed. On the other hand, no two-dimensional hole gas is generated on the surface of the diamond layer 2B where the hydrogen-terminated layer 8B does not exist. Therefore, in the FET 100B, the two-dimensional hole gas generated inside the source-side boron-doped diamond layer 4B and the two-dimensional hole gas generated inside the drain-side boron-doped diamond layer 4B are separated and do not exist continuously. Therefore, when the FET 100B is in the OFF state ($V_{GS}$=0 V), a hole crosses from the source-side boron-doped diamond layer 4B into the diamond layer 2B, and cannot reach the drain electrode 7B through the drain-side boron-doped diamond layer 4B. As a result, no current flows between the source electrode 6B and the drain electrode 7B of the FET 100B, and thus the FET 100B is not normally on.

In order to turn on the FET 100B, set $V_{GS}$=−5 V and $V_{DS}$=−10 V. In order to switch the FET 100B from an ON state to the OFF state, $V_{GS}$=0 V is set while $V_{DS}$=−10V is maintained. Since the FET 100B is the normally-off enhancement-type FET different from the related-art diamond FET, the FET 100B can be turned off by setting $V_{GS}$=0 V.

Next, a flow of a hole current when the FET 100B is in the ON state will be described. Even when the gate voltage $V_{GS}$ applied to the gate electrode 12B is 0 V, a two-dimensional hole gas is induced directly below the surface of the boron-doped diamond layer 4B from the end portion of the source electrode 6B to the silicon oxide film 3B. When the gate voltage $V_{GS}$ and the drain voltage $V_{DS}$ corresponding to the ON state are applied to the FET 100B as described above, the holes H start to move from a source electrode 6B side toward a drain electrode 7B side. Here, since the FET 100B uses the boron-doped diamond layer 4B having a low resistance, the two-dimensional hole gas directly below the surface of the boron-doped diamond layer 4B does not contribute to the hole current. Therefore, in the FET 100B, even if the hydrogen-terminated layer 8B for inducing the two-dimensional hole gas is omitted, an on-current of the FET 100B does not decrease.

Figure 21:
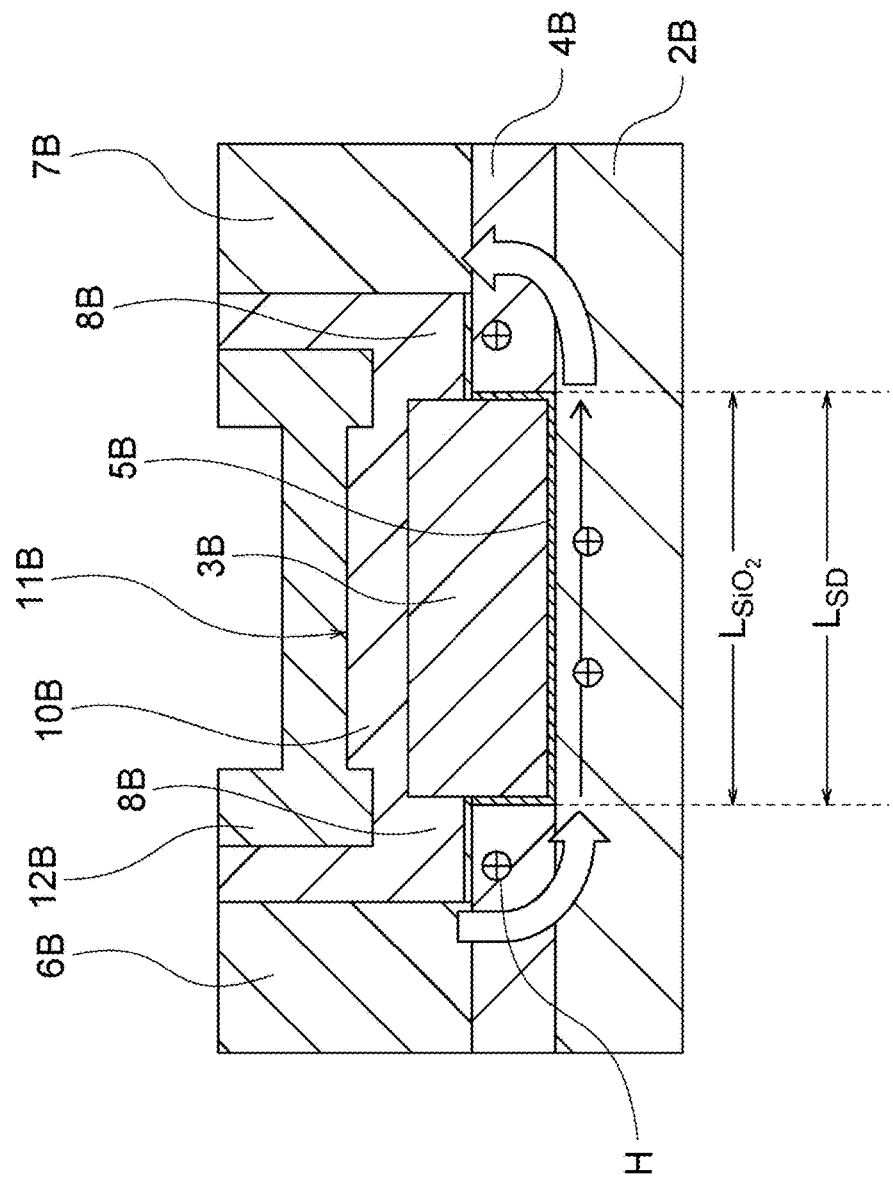
FIG. 21 is an operation explanatory view of the FET according to the second embodiment of the invention.

As indicated by an arrow in FIG. 21, the holes H flow out from the source electrode 6B and moves inside the source-side boron-doped diamond layer 4B toward the diamond layer 2B (downward direction in FIG. 21).

Next, the holes H that have reached the diamond layer 2B moves inside the diamond layer 2B toward the drain-side boron-doped diamond layer 4B along the silicon-terminated layer 5B. The holes H that have moved to the drain-side boron-doped diamond layer 4B move inside the drain-side boron-doped diamond layer 4B toward the drain electrode 7B and reaches the drain electrode, as indicated by an arrow in FIG. 21. Thereby, the on-current of the FET 100B flows from the source electrode 6B to the drain electrode 7B.

(Producing Method)

Next, a method for producing the FET 100B according to the second embodiment will be described. Description common to that of the producing method according to the first embodiment may be omitted.

First, the non-doped diamond layer 2B (hereinafter also referred to as the diamond layer 2B) is formed on a surface of the diamond substrate 1B by epitaxial growth with a thickness of, for example, 200 nm or larger and 5 μm or smaller by a microwave CVD method. Next, the silicon oxide film 3B having a thickness of, for example, 250 nm is formed on a surface of the diamond layer 2B by a plasma CVD method.

Subsequently, a photoresist mask is formed on the silicon oxide film 3B. A general photolithography method may be used for the photoresist mask. Next, the silicon oxide film 3B in a region not covered with the photoresist mask is selectively etched and removed by a RIE method. Next, a photoresist is removed using an organic solvent such as acetone. Through these steps, a region where the silicon oxide film 3B is formed on the diamond layer 2B and regions where the silicon oxide film 3B is removed and the diamond layer 2B is exposed are formed on the diamond substrate 1B.

Next, the boron-doped diamond layers 4B are formed on the exposed diamond layer 2B by selective epitaxial growth by a high-temperature plasma treatment in a reducing atmosphere using a CVD device, using the silicon oxide film 3B formed by the etching treatment as a mask. A thickness of the boron-doped diamond layer 4B is, for example, 150 nm.

As conditions of the selective epitaxial growth of the boron-doped diamond layers 4B, for example, the selective epitaxial growth is preferably performed by discharging plasma at a growth temperature of 900° C. or higher in a reducing atmosphere containing approximately 85% of hydrogen, approximately 5% of methane, and approximately 10% of a mixed gas made of 1% of trimethylboron (TMB) and 99% of hydrogen for TMB dilution. When 85% of hydrogen, 5% of methane, 10% of the mixed gas made of 1% of TMB and 99% of hydrogen are contained, a gas ratio in the atmosphere containing an amount of hydrogen for TMB dilution is accurately 94.9% of hydrogen, 5% of methane, and 0.1% of TMB.

The selective epitaxial growth of the boron-doped diamond layers 4B is homo-epitaxial growth, in which a growth layer is epitaxially grown on the same material. In the present embodiment, the boron-doped diamond layers 4B as the growth layer are selectively epitaxially grown on the exposed diamond layer 2B, and are not grown on the silicon oxide film 3B.

Figure 22:
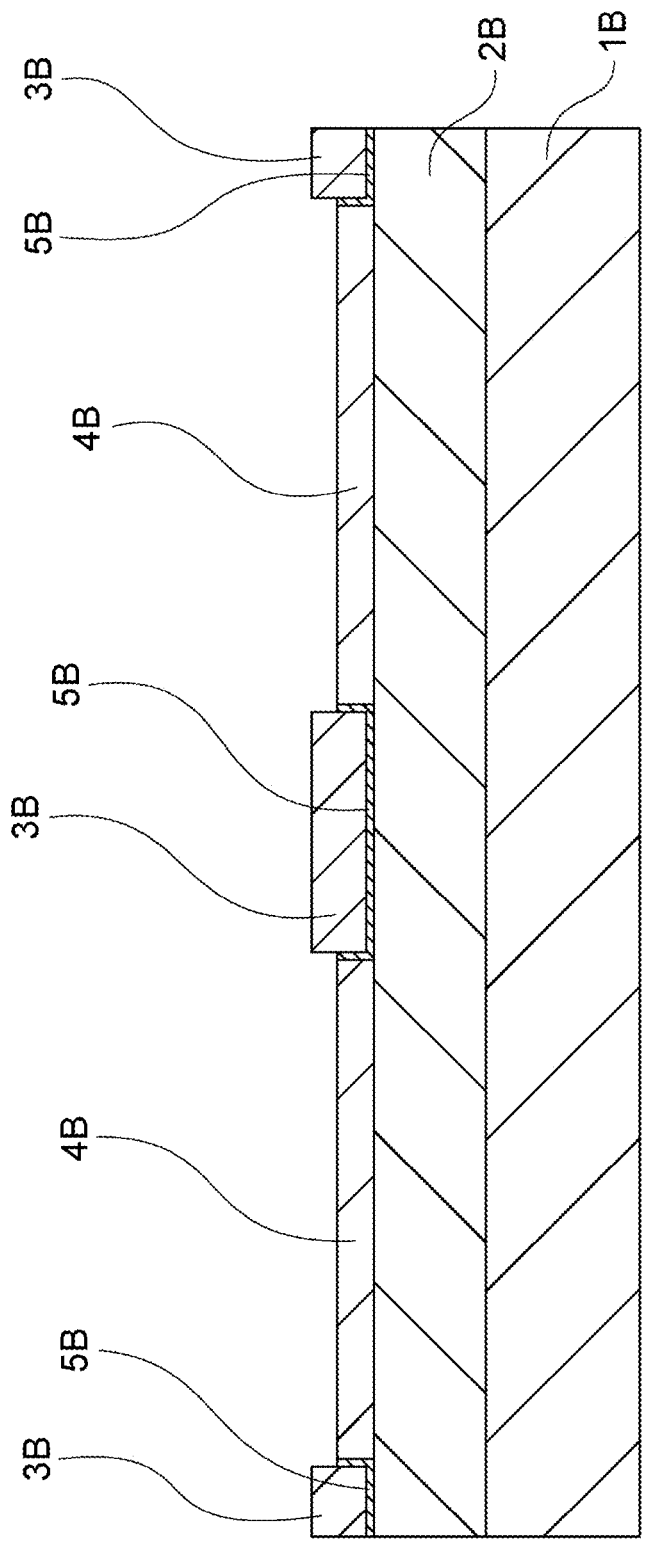
FIG. 22 is a cross-sectional view showing a method for producing the FET according to the second embodiment of the invention in a stepwise way, and is a cross-sectional view showing a stage when a diamond layer and a silicon-terminated layer are formed.

The selective epitaxial growth of the boron-doped diamond layers 4B starts from the exposed surface of the diamond layer 2B, and then proceeds upward. As described above, in the present embodiment, the thickness of the silicon oxide film 3B is 250 nm, and the thickness of the boron-doped diamond layer 4B is 150 nm. Therefore, side walls on both sides of the silicon oxide film 3B are exposed by approximately 100 nm. A cross-sectional view after the boron-doped diamond layer 4B is formed as described above is shown in FIG. 22.

The silicon-terminated layer 5B is formed at an interface between the diamond layer 2B and the silicon oxide film 3B and at interfaces between the boron-doped diamond layers 4B and the silicon oxide film 3B during the selective epitaxial growth of the boron-doped diamond layers 4B. More specifically, as shown in FIG. 20, the silicon-terminated layer 5B is formed at an interface between the surface of the diamond layer 2B and a bottom surface of the silicon oxide film 3B and at an interface between a side surface of the source-side and drain-side boron-doped diamond layer 4B and each of both side surfaces of the silicon oxide film 3B.

Methods for producing the source electrode 6B, the drain electrode 7B, the hydrogen-terminated layer 8B, the device isolation layer 9B, the insulating film 10B, and the gate electrode 12B to be carried out subsequently, and a method for producing a metal wire to be further carried out as necessary thereafter are the same as those of the first embodiment, and thus description thereof will be omitted.

As described above, the selective epitaxial growth of the boron-doped diamond layers 4B is performed in the reducing atmosphere containing a large amount of hydrogen. Therefore, when the boron-doped diamond layers 4B are sufficiently hydrogen-terminated during the selective epitaxial growth, the above-described hydrogen plasma irradiation step can be omitted.

The gate insulating film 11B of the FET 100B includes the silicon oxide film 3B and the insulating film 10B formed on the silicon oxide film 3B. The insulating film 10B on the boron-doped diamond layers 4B functions as a passivation film that protects the hydrogen-terminated layers 8B on surfaces of the source-side and drain-side diamond layers 4B. The insulating film 10B on the source electrode 6B and the drain electrode 7B functions as an interlayer insulating film that electrically isolates the source electrode 6B and the drain electrode 7B from the gate electrode 12B.

The insulating film 10B on the silicon oxide film 3B may be omitted as necessary. That is, the gate insulating film 11B of the FET 100B may be formed of only the silicon oxide film 3B. In this case, for example, a photolithography process and an etching process for removing only the insulating film 10B on the silicon oxide film 3B may be appropriately added.

<Functions and Effects>

The FET 100B according to the second embodiment constitutes a FET in which the silicon oxide film 3B on the surface of the diamond layer 2B and the gate electrode 12B are formed, and effects the same as those of the first embodiment can be obtained.

In the present embodiment, diamond layers in the source region and the drain region are not non-doped diamond layers but the boron-doped diamond layers 4B, thereby reducing the resistance in each of the source region and the drain region. Therefore, the on-state current of the FET 100B can be increased.

In the present embodiment, the boron-doped diamond layers 4B are formed to be thinner than the silicon oxide film 3B, and there is no overhang portion formed by the boron-doped diamond layers 4B getting over the surface of the silicon oxide film 3B. As described above, a fact that the boron-doped diamond layers 4B separately serving as the source region and the drain region is thin and there is no overhang portion means that a current path between the source electrode 6B and the drain electrode 7B is shortened in the FET 100B. Therefore, the on-current of the FET 100B can be increased. Further, the FET 100B achieves normally-off characteristics, which is one of important issues in power devices.

In the present embodiment, the silicon-terminated layer 5B can be formed in a selective epitaxial growth step for the boron-doped diamond layers 4B, and thus the silicon-terminated layer 5B can be formed without increasing the number of steps compared to the related art. Therefore, there is no particular reason for separately providing a step of forming the silicon-terminated layer 5B in order to produce the FET 100B, but the step of forming the silicon-terminated layer 5B may be provided separately from the selective epitaxial growth step for the boron-doped diamond layers 4B as necessary.

For example, when it is desired to change the conditions for the selective epitaxial growth of the boron-doped diamond layers 4B, the high-temperature plasma treatment in the reducing atmosphere may be performed as the step of forming the silicon-terminated layer 5B at an appropriate stage after the selective epitaxial growth of the boron-doped diamond layers 4B is completed.

For example, in a case where the selective epitaxial growth of the boron-doped diamond layers 4B is not performed, or in a case of a FET having a structure in which the boron-doped diamond layers 4B are not used, the high-temperature plasma treatment in the reducing atmosphere may be performed as the step of forming the silicon-terminated layer 5B at an appropriate stage after the silicon oxide film 3B is formed on the surface of the diamond layer 2B.

EXAMPLES

First Example

In a first example, a sample of the FET 100A having the configuration shown in FIG. 1 was produced according to the producing method described in the first embodiment. Specifications of the produced FET 100A are as follows.

The diamond layer 2A was non-doped and had a thickness of 2 μm. The source-side and drain-side diamond layers 4A were non-doped and each had a thickness of 330 nm. A thickness of the silicon oxide film 3A was 260 nm, a thickness of the insulating film 10A was 100 nm, and a thickness of the gate insulating film 11A was 360 nm, which is a sum of the thickness of the silicon oxide film 3A and the thickness of the insulating film 10A. A thickness of the gate electrode 12A was 100 nm.

In producing steps of the produced FET 100A, an IB-type crystal orientation (100) substrate containing nitrogen was used as the diamond substrate 1A. First, the non-doped diamond layer 2A was formed on a surface of the diamond substrate 1A by epitaxial growth with a film thickness of 2 μm. The epitaxial growth of the non-doped diamond layer 2A was performed by a chemical vapor deposition method using microwave-excited plasma (microwave plasma chemical vapor deposition). After the non-doped diamond layer 2A was formed, a UV-$O_3$ treatment was performed.

Subsequently, the silicon oxide film 3A having a thickness of 260 nm was formed on a surface of the non-doped diamond layer 2A by a plasma CVD method. A TEOS gas was used as a raw material gas for plasma CVD, and a film forming temperature was 300° C.

Next, a photoresist mask was formed on the silicon oxide film 3A, and then the silicon oxide film 3A was etched using an inductively coupled plasma (ICP)-RIE device. $C_3F_8$ was used as an etching gas, and an etching treatment was performed without using hydrogen.

Next, the non-doped diamond layers 4A were selectively epitaxially grown by a CVD method on the non-doped diamond layer 2A exposed by the etching treatment for the silicon oxide film 3A, using the silicon oxide film 3A formed by the etching treatment for the silicon oxide film 3A as a mask. A thickness of the non-doped diamond layer 4A was 330 nm.

Selective epitaxial growth of the non-doped diamond layers 4A was performed by discharging plasma at a temperature of 800° C. in a reducing atmosphere containing 99.5% of hydrogen and 0.5% of methane.

Next, a photoresist mask having openings only in regions for forming the source electrode 6A and the drain electrode 7A was formed on the non-doped diamond layers 4A and the silicon oxide film 3A by the photolithography method. Subsequently, a deposited film made of metals including Ti, Pt, and Al was sequentially formed as metals constituting each of the source electrode 6A and the drain electrode 7A on the exposed non-doped diamond layers 4A and the photoresist mask by an electron beam evaporation method. A film thickness of Ti was 20 nm, a film thickness of Pt was 30 nm, and a film thickness of Au was 100 nm.

Next, the photoresist and the metal deposited film formed on the photoresist were removed using acetone. As described above, the source electrode 6A was formed on a surface of the source-side non-doped diamond layer 4A and the drain electrode 7A was formed on a surface of the drain-side non-doped diamond layer 4A by a lift-off process. Subsequently, a carbide treatment was performed to turn the Ti layer into TiC. In the carbide treatment, first, the diamond substrate 1A was subjected to a heat treatment in a hydrogen gas atmosphere at 500° C. for 50 minutes, and then the diamond substrate 1A was rapidly cooled. Thereby, a low-resistance carbide layer made of TiC was formed between the Ti layer and the non-doped diamond layers 4A.

Next, the diamond substrate 1A was exposed to hydrogen plasma for 30 minutes while being heated to 450° C. Thereby, the exposed surface of the diamond layers 4A were hydrogen-terminated to form the hydrogen-terminated layers 8A.

Next, the photoresist 30 covering a region to be a channel portion of the FET 100A was formed. The silicon oxide film 3A was etched by an ICP-RIE device using the photoresist 30 as a mask. $C_3F_8$ was used as an etching gas, and an etching treatment was performed without using hydrogen.

After etching the silicon oxide film 3A, the diamond substrate 1A was exposed to oxygen plasma at a room temperature and an atmospheric pressure in a plasma reactor device without removing the photoresist 30. Thereby, surfaces of the non-doped diamond layer 2A and the non-doped diamond layers 4A not covered with the photoresist 30 were oxygen-terminated to form the device isolation layer 9A. The hydrogen-terminated layers 8A located in a region not covered with the photoresist 30 were changed from a hydrogen-terminated state to an oxygen-terminated state by the oxygen plasma treatment.

After the photoresist 30 was removed, $Al_2O_3$ to be the insulating film 10A having a thickness of 100 nm was formed using trimethylaluminum as a precursor of Al and water ($H_2O$) as an oxidant, at a temperature of 450° C. for the diamond substrate 1A, in an ALD device.

Subsequently, parts of the insulating film 10A on the source electrode 6A and the drain electrode 7A were removed by the photolithography method and a wet etching method to form openings for bonding and contact of probe needles.

Subsequently, a photoresist having an opening only in a region for forming the gate electrode 12A was formed on the insulating film 10A by the photolithography method. Next, Al was formed on the insulating film 10A to a thickness of 100 nm by the electron beam evaporation method, and then the photoresist and Al formed on the photoresist were removed by acetone to form the gate electrode 12A. An electrode pad (not shown) for the gate electrode 12A was formed at a position where the gate electrode 12A was extended in a direction perpendicular to the cross section of FIG. 1.

In Sample 1 of the produced FET 100A, the width $L_{SiO2}$ of the silicon oxide film 3A on the non-doped diamond layer 2A was 6 μm, the interval $L_{SD}$ between the source electrode 6A and the drain electrode 7A was 16 μm, and the gate width W was 25 μm.

Figure 23A:
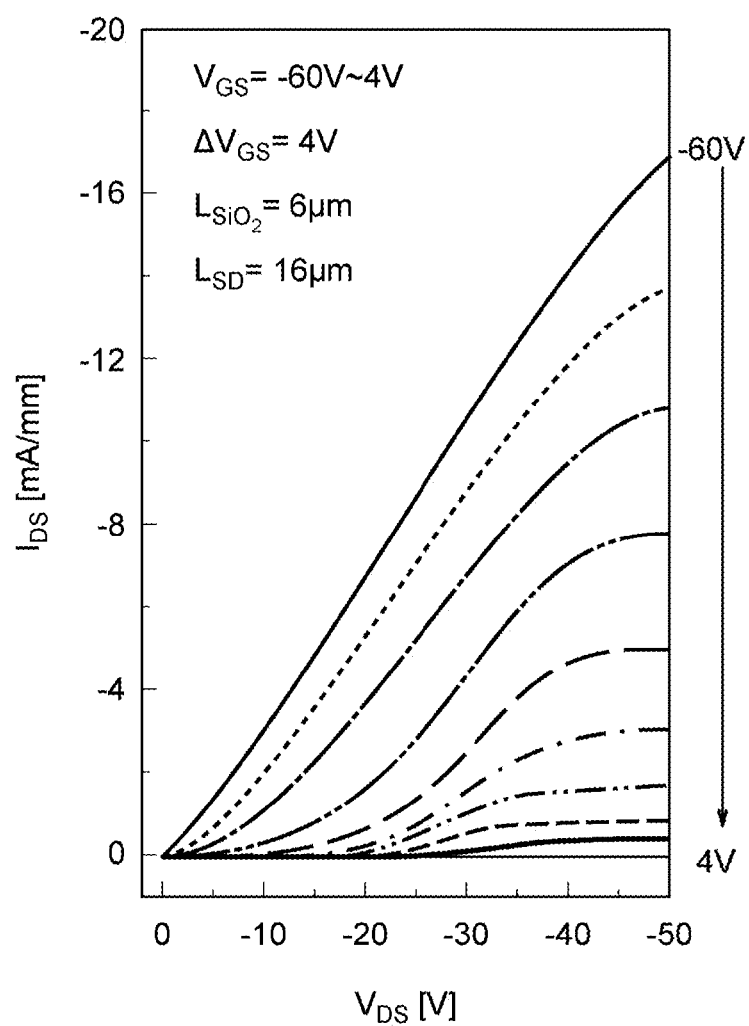
FIG. 23A is a graph showing measurement results of a FET 100A according to a first example of the invention, and is a graph showing drain voltage-drain current characteristics.

Drain voltage-drain current ($V_{DS}$-$I_{DS}$) characteristics of Sample 1 were measured at the room temperature. In this measurement, the drain voltage $V_{DS}$ was changed from 0 V to −50 V. The gate voltage $V_{DS}$ was changed by +4 V in a positive direction within a range of −60 V to +4 V. FIG. 23A shows measurement results of the $V_{DS}$-$I_{DS}$ characteristics of Sample 1. In FIG. 23A, a horizontal axis represents $V_{DS}$ [V], and a vertical axis represents [mA/mm], which is a unit for normalizing $I_{DS}$ with the gate width W.

As shown in FIG. 23A, Sample 1 showed good $V_{DS}$-$I_{DS}$ characteristics with a maximum value of the drain current $I_{DS}$ of −17 mA/mm. In addition, it was confirmed that the drain current $I_{DS}$ was successfully controlled by changing the gate voltage $V_{GS}$.

Figure 23B:
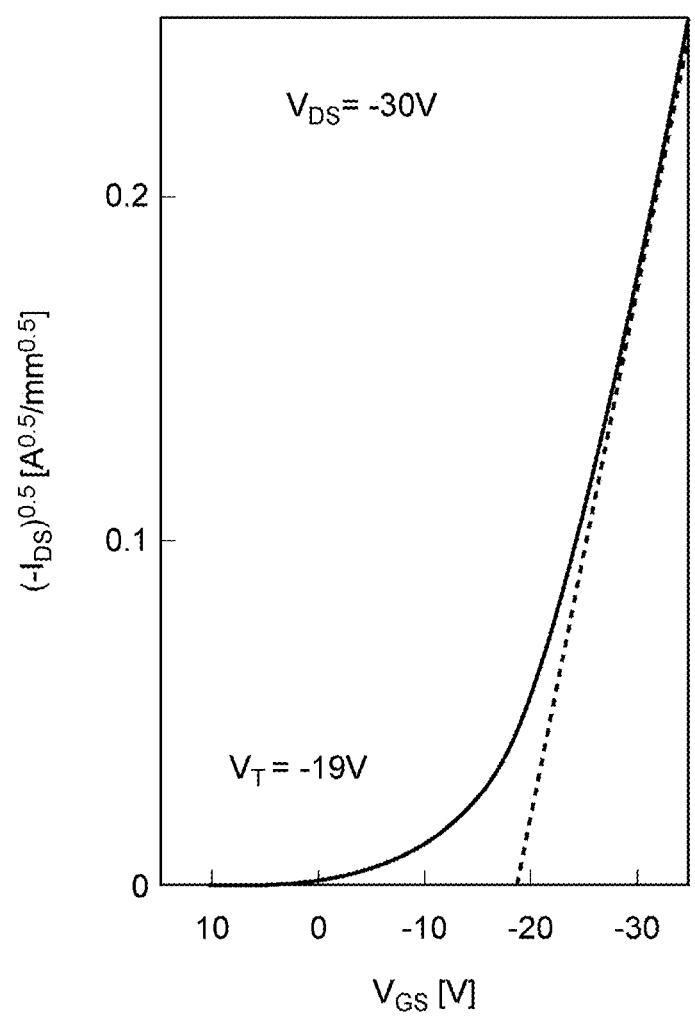
FIG. 23B is a graph showing measurement results of the FET 100A according to the first example of the invention, and is a graph in which a vertical axis is shown on a linear scale in the graph showing gate voltage-drain current characteristics.
Figure 23C:
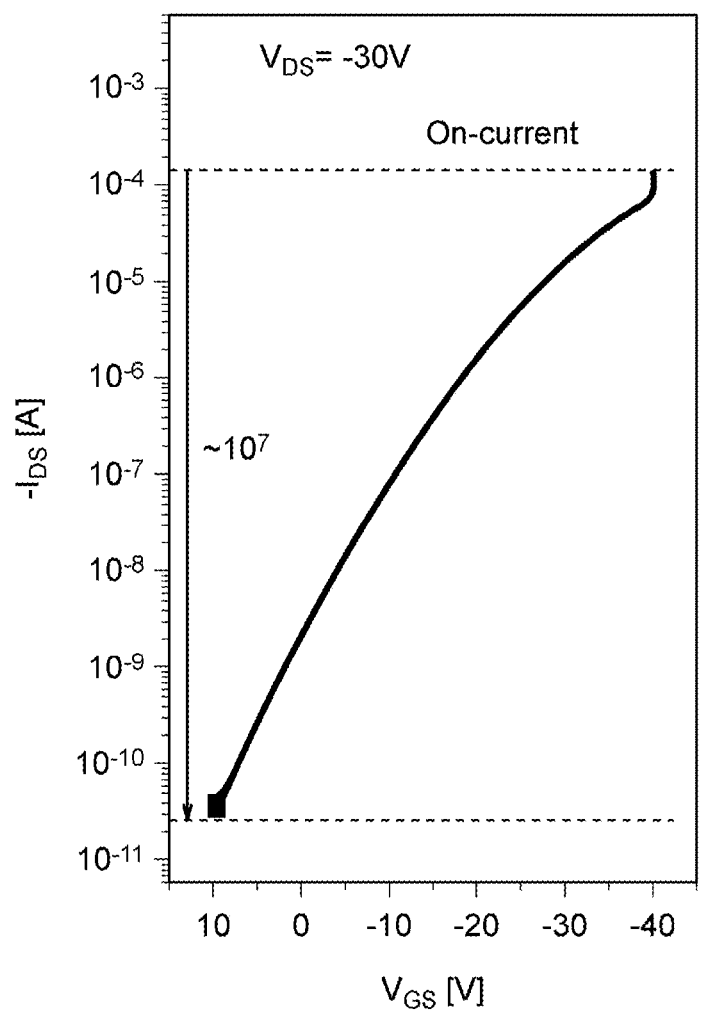
FIG. 23C is a graph showing measurement results of the FET 100A according to the first example of the invention, and is a graph in which a vertical axis is shown on a log scale in the graph showing the gate voltage-drain current characteristics.

Subsequently, gate voltage-drain current ($V_{GS}$-$I_{DS}$) characteristics of Sample 1 were measured at the room temperature. In this measurement, the drain voltage $V_{DS}$ was −30 V, and the gate voltage $V_{GS}$ was increased from +10 V to −40 V. FIGS. 23B and 23C show measurement results of the $V_{GS}$-$I_{DS}$ characteristics of Sample 1. In FIG. 23B, a horizontal axis represents $V_{GS}$ [V], and a vertical axis is shown on a linear scale using "$(-I_{DS})^{0.5}$ [$A^{0.5}$/$mm^{0.5}$]" as a unit for normalizing $I_{DS}$ with the gate width W. In FIG. 23C, a horizontal axis represents $V_{GS}$ [V], and a unit of a vertical axis is $-I_{DS}$ [A], which is shown on a logarithmic scale.

As shown in FIGS. 23B and 23C, Sample 1 showed good $V_{GS}$-$I_{DS}$ characteristics. From the results shown in FIG. 23B, it was confirmed that a threshold voltage $V_T$ of the FET 100A was −19 V, and normally-off was implemented in which no current flows when the gate voltage $V_{GS}$=0 V was satisfied. From the results shown in FIG. 23C, it was confirmed that a difference between an ON current and an OFF current of the FET 100A was approximately seven digits.

From the measurement results of Sample 1 of the FET 100A, it was confirmed that the FET 100A had good transistor characteristics, and the characteristics satisfied a level required for a FET for a power device.

Second Example

In a second example, a sample of the FET 100B having the configuration shown in FIG. 20 was produced according to the producing method described in the second embodiment. Specifications of the produced FET 100B are as follows.

The diamond layer 2B was non-doped and had a thickness of 2 μm. The source-side and drain-side diamond layers 4B were boron-doped and had a thickness of 130 nm. A thickness of the silicon oxide film 3B was 260 nm, a thickness of the insulating film 10B was 100 nm, and a thickness of the gate insulating film 11B was 360 nm, which is a sum of the thickness of the silicon oxide film 3B and the thickness of the insulating film 10B. A thickness of the gate electrode 12B was 100 nm.

The method for producing the produced FET 100B will be described. Formation of the silicon oxide film 3B and formation of the boron-doped diamond layers 4B will be described, and descriptions of the other steps similar to those of the first example will be omitted.

The silicon oxide film 3B having a thickness of 260 nm was formed on a surface of the non-doped diamond layer 2B by a plasma CVD method. A TEOS gas was used as a raw material gas for plasma CVD, and a film forming temperature was 300° C.

Next, a photoresist mask was formed on the silicon oxide film 3B, and then the silicon oxide film 3B was etched using an ICP-RIE device. $C_3F_8$ was used as an etching gas, and an etching treatment was performed without using hydrogen.

Next, the diamond layers 4B doped with boron, which is a p-type impurity, were selectively epitaxially grown by a CVD method on the non-doped diamond layer 2B exposed by the etching treatment for the silicon oxide film 3B, using the silicon oxide film 3B after the etching treatment as a mask. A film thickness of the boron-doped diamond layer 4B was 130 nm.

Selective epitaxial growth of the boron-doped diamond layers 4B was performed by discharging plasma at a temperature of 960° C. in a reducing atmosphere to which 85% of hydrogen, 5% of methane, and 10% of a mixed gas made of 1% of TMB and 99% of hydrogen for TMB dilution were added. A gas ratio in the reducing atmosphere was accurately 94.9% of hydrogen, 5% of methane, and 0.1% of TMB. It was confirmed that boron was contained in the formed boron-doped diamond layers 4B at a concentration of $1 \times 10^{21}$ $cm^{-3}$.

Methane ($CH_4$) contains four hydrogen atoms. Therefore, it is considered that a substantial hydrogen concentration during the selective epitaxial growth was higher than 94.9% due to the hydrogen atoms contained in 5% of methane.

In Sample 2 of the produced FET 100B, the width $L_{SiO2}$ of the silicon oxide film 3B on the non-doped diamond layer 2B was 6 μm, the interval $L_{SD}$ between the source-side and drain-side boron-doped diamond layers 4B was 6 μm, which was the same as $L_{SiO2}$, an interval between the source electrode 6A and the drain electrode 7A was 16 μm, and the gate width W was 25 μm. When measurement conditions and a unit shown in a graph are the same as those in the first example, description thereof will be omitted.

Figure 24A:
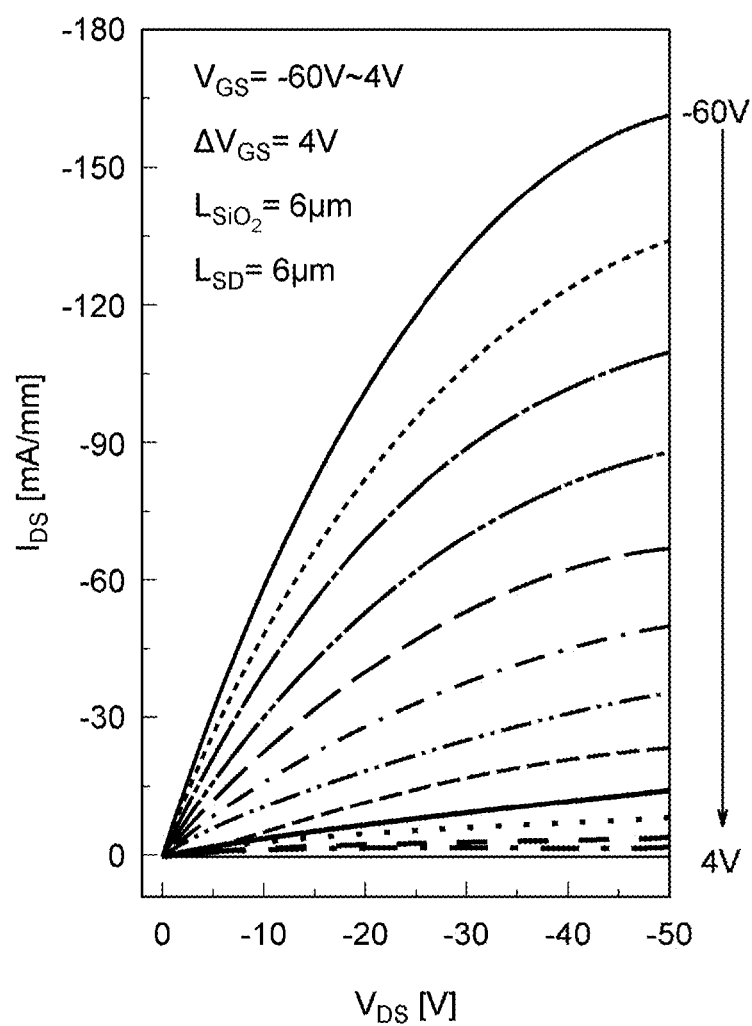
FIG. 24A is a graph showing measurement results of a FET 100B according to a second example of the invention, and is a graph showing drain voltage-drain current characteristics.

FIG. 24A shows measurement results of drain voltage-drain current ($V_{DS}$-$I_{DS}$) characteristics of Sample 2 at a room temperature. As shown in FIG. 24A, Sample 2 showed good $V_{DS}$-$I_{DS}$ characteristics with a maximum value of the drain current $I_{DS}$ of −165 mA/mm.

Figure 24B:
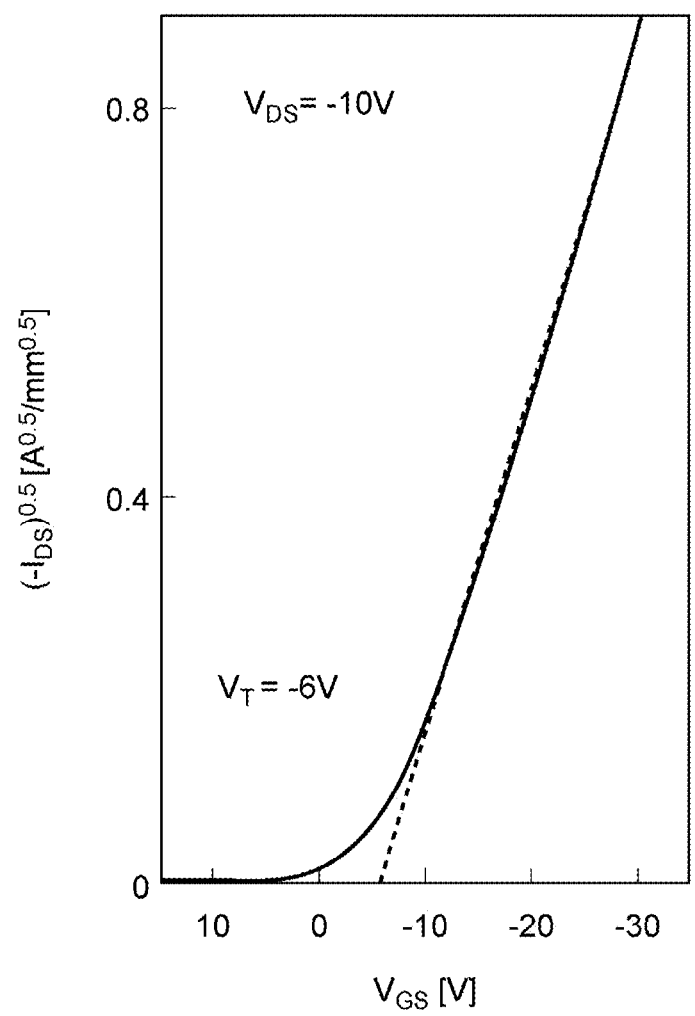
FIG. 24B is a graph showing measurement results of the FET 100B according to the second example of the invention, and is a graph in which a vertical axis is shown on a linear scale in the graph showing gate voltage-drain current characteristics.
Figure 24C:
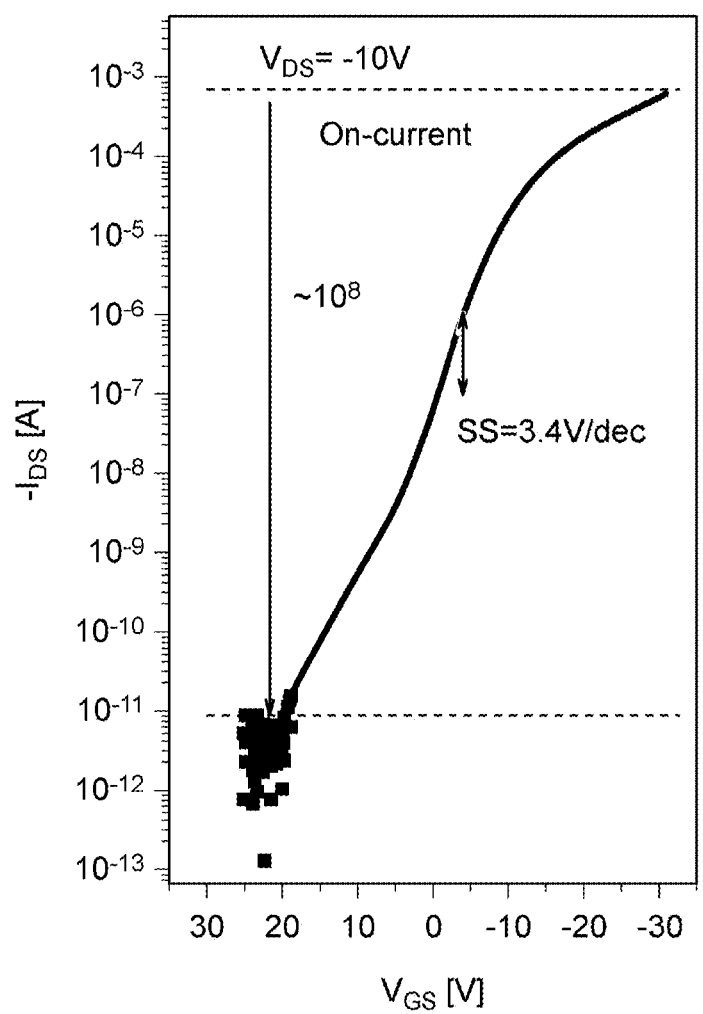
FIG. 24C is a graph showing measurement results of the FET 100B according to the second example of the invention, and is a graph in which a vertical axis is shown on a log scale in the graph showing the gate voltage-drain current characteristics.

Subsequently, FIGS. 24B and 24C show measurement results of gate voltage-drain current ($V_{GS}$-$I_{DS}$) characteristics of Sample 2 at the room temperature. In this measurement, the drain voltage $V_{DS}$ was −10 V, and the gate voltage $V_{GS}$ was increased from +30 V to −30 V.

As shown in FIGS. 24B and 24C, Sample 2 showed good $V_{GS}$-$I_{DS}$ characteristics. From the results shown in FIG. 24B, it was confirmed that the threshold voltage $V_T$ of the FET 100B was −6 V, and normally-off was implemented in which no current flows when the gate voltage $V_{GS}$=0 V was satisfied. From the results shown in FIG. 24C, it was confirmed that a difference between an ON current and an OFF current of the FET 100B was approximately eight digits.

From the measurement result of Sample 2 of the FET 100B, it was confirmed that the FET 100B had good transistor characteristics, and the characteristics satisfied a level required for a FET for a power device. As for the maximum value of the drain current $I_{DS}$, the FET 100B showed a value approximately 10 times that of the FET 100A. This is considered to be an effect of forming a source region and a drain region with the boron-doped diamond layers 4B each having a lower resistance than the non-doped diamond layer 4A.

A contact resistance between the boron-doped diamond layer 4B and each of the source electrode 6B and the drain electrode 7B is lower than a contact resistance between the non-doped diamond layer 4A and each of the source electrode 6A and the drain electrode 7A. In addition, the thickness of the non-doped diamond layer 4A of the FET 100A is 330 nm and the overhang portion 4a is provided, whereas the thickness of the boron-doped diamond layer 4B of the FET 100B is 150 nm and the overhang portion 4a is not provided. That is, in a case of the FET 100B, a series resistance component having a resistance higher than that of the FET 100A and a thickness larger than that of the FET 100A is connected to a current path from a source to a drain. For the reason described above, it is considered that there is a difference in the drain current $I_{DS}$ between the FET 100A and the FET 100B.

Third Example

In a third example, a sample (hereinafter, referred to as sample 3) for analyzing the silicon-terminated layer 5B was produced, and analysis was performed using X-ray photoelectron spectroscopy (XPS).

Sample 3 was produced by forming the non-doped diamond layer 2B and the silicon oxide film 3B on the diamond substrate 1B, and then performing only a plasma treatment in a reducing atmosphere without selective epitaxial growth of the boron-doped diamond layers 4B to remove the silicon oxide film 3B. A method for forming the non-doped diamond layer 2B and the silicon oxide film 3B and thicknesses thereof are the same as those of the second example.

In producing steps of Sample 3, an IB-type crystal orientation (100) substrate containing nitrogen was used as the diamond substrate 1B. First, the non-doped diamond layer 2B was formed on a surface of the diamond substrate 1B by epitaxial growth with a thickness of 2 μm. Subsequently, a surface of the non-doped diamond layer 2B was cleaned, washed with a hot mixed acid containing sulfuric acid and nitric acid at a ratio of 3:1 for oxygen termination, and then subjected to a UV-$O_3$ treatment.

Subsequently, the silicon oxide film 3B having a thickness of 260 nm was formed on a surface of the non-doped diamond layer 2B by a plasma CVD method. A TEOS (tetraethoxysilane) gas was used as a raw material gas for plasma CVD, and a film forming temperature was 300° C.

Next, a treatment was performed under the same conditions as in Example 2 except that the selective epitaxial growth of the boron-doped diamond layers 4B was not performed, that is, a treatment of discharging plasma was performed at a temperature of 960° C. in a reducing atmosphere to which 85% of hydrogen, 5% of methane, and 10% of a mixed gas made of 1% of TMB and 99% of hydrogen for TMB dilution were added. A gas ratio in the reducing atmosphere containing an amount of hydrogen for TMB dilution was accurately 94.9% of hydrogen, 5% of methane, and 0.1% of TMB.

Subsequently, Sample 3 was produced by removing the silicon oxide film 3B formed on the surface of the non-doped diamond layer 2B using hydrogen fluoride.

Figure 25A:
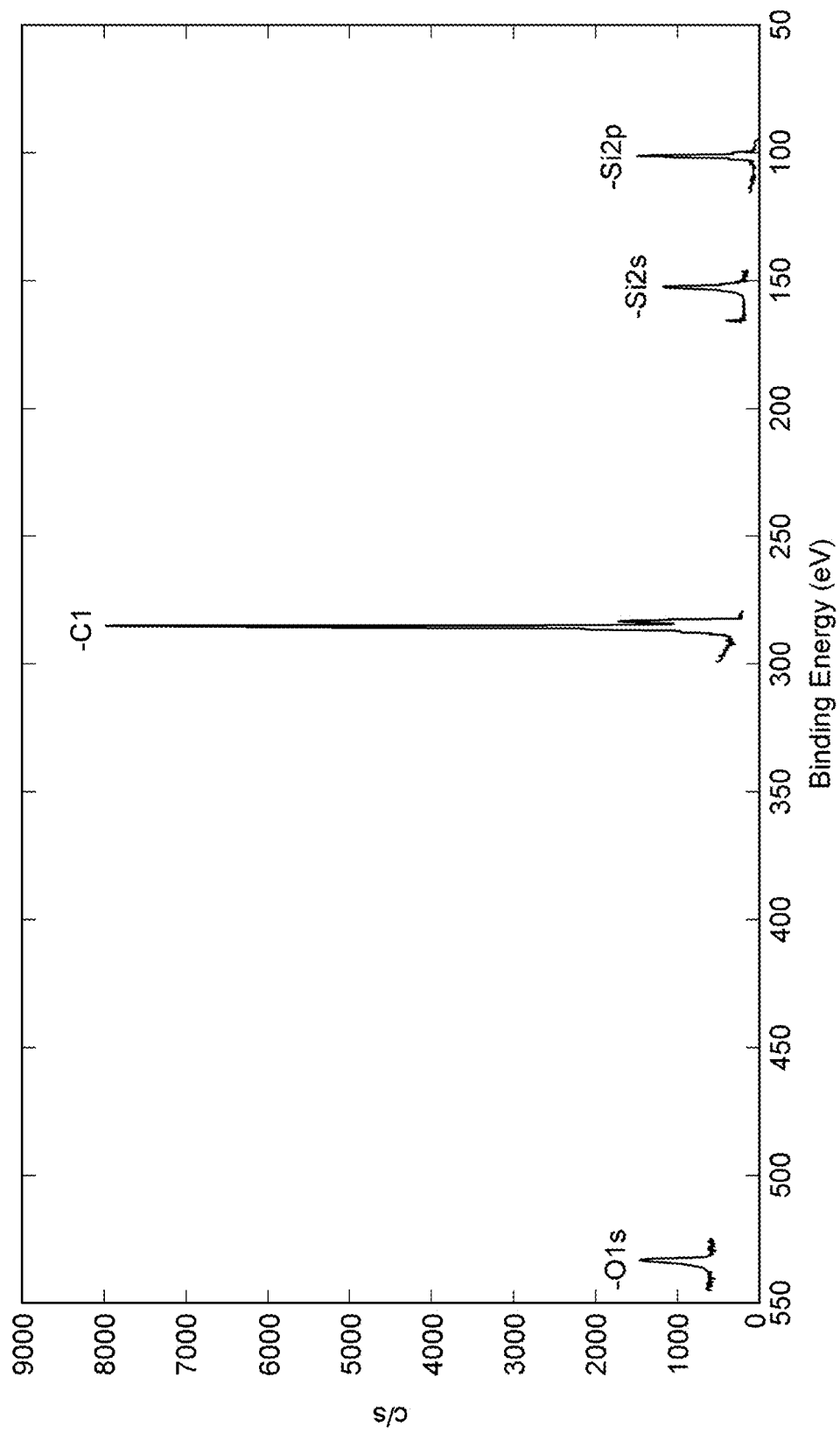
FIG. 25A is a diagram showing an XPS analysis result according to a third example of the invention, and is a diagram showing a binding energy intensity of 50 eV to 550 eV.
Figure 25B:
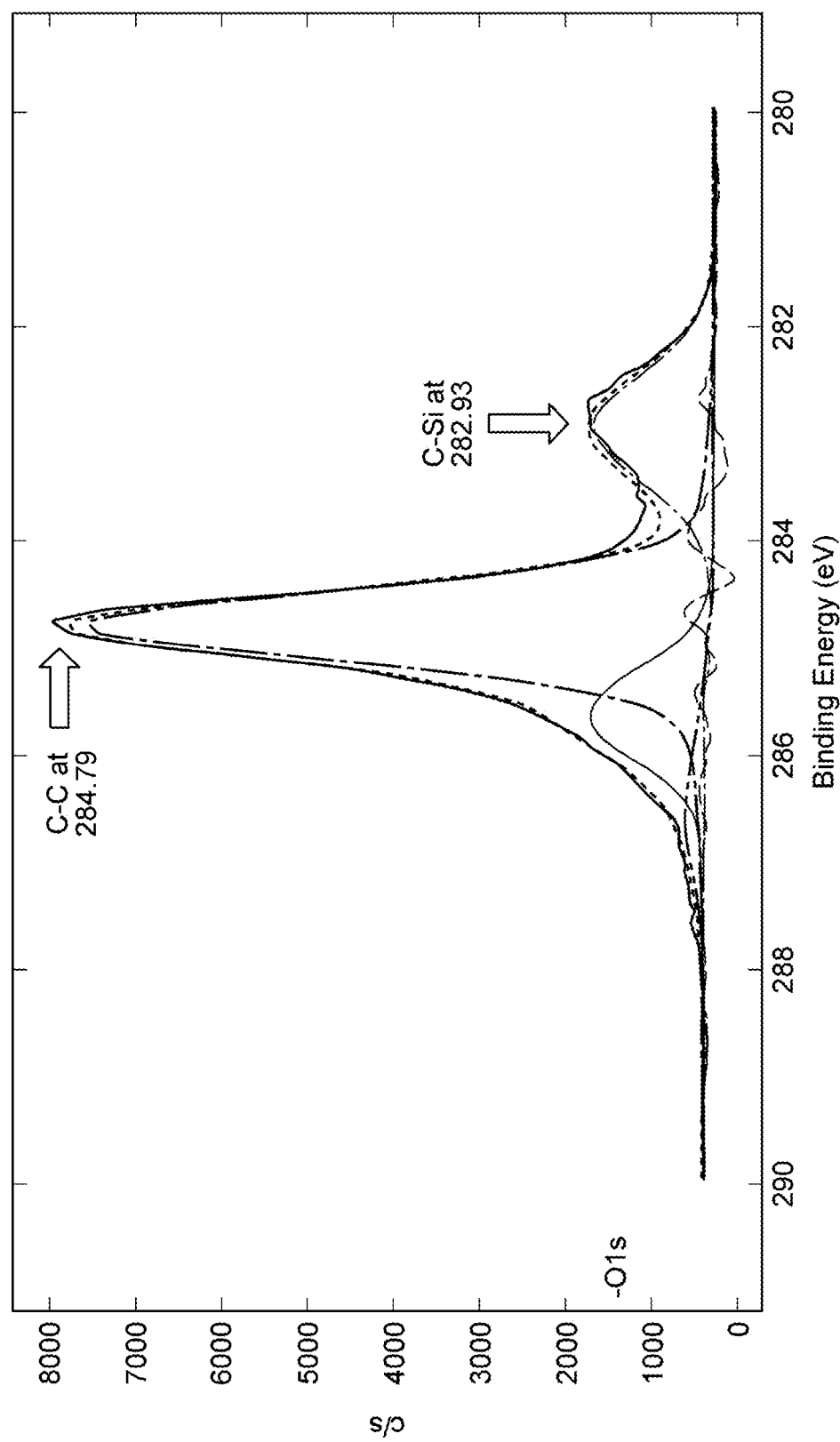
FIG. 25B is a diagram showing an XPS analysis result according to the third example of the invention, and is a diagram showing a binding energy intensity of 280 eV to 290 eV.

FIGS. 25A and 25B show results of measuring Sample 3 with XPS. In each of FIGS. 25A and 25B, a horizontal axis represents binding energy, and a vertical axis c/s represents a detection intensity. FIG. 25A is an analysis result in a wide scan mode, and shows peaks detected in a range of binding energy of 50 eV to 550 eV. As shown in FIG. 25A, it was confirmed that a strong peak C1 was present in a vicinity of 280 eV. In addition, a peak Si2p was confirmed in a vicinity of 100 eV, and a peak Si2s was confirmed in a vicinity of 160 eV.

FIG. 25B shows a measurement result in a narrow scan mode with high resolution in a range of 280 eV to 290 eV in a vicinity of the strong peak C1 confirmed in the wide scan mode. As shown in FIG. 25B, C—C is detected at 284.79 eV. Further, a peak due to a chemical shift derived from C—Si was observed at 282.93 eV.

A fact that the peaks as described above was confirmed by XPS analysis of the surface of the non-doped diamond layer 2B after the silicon oxide film 3B was removed indicates that the silicon-terminated layer 5B was formed at an interface between the silicon oxide film 3B and the non-doped diamond layer 2B of Sample 3. That is, it was confirmed that the silicon-terminated layer 5B was formed only by the plasma treatment in the reducing atmosphere without the selective epitaxial growth of the boron-doped diamond layers 4B. This indicates that a treatment of forming the silicon-terminated layer 5A and a selective epitaxial growth treatment for the boron-doped diamond layers 4B can be performed independently. In a case where the selective epitaxial growth of the boron-doped diamond layers 4B is not performed, or in a case of a FET having a structure in which the boron-doped diamond layers 4B are not used, it was confirmed that the high-temperature plasma treatment in the reducing atmosphere may be performed as a step of forming the silicon-terminated layer 5B at an appropriate stage after the silicon oxide film 3B is formed on the surface of the non-doped diamond layer 2B. This is considered to be the same for a treatment of forming the non-doped diamond layers 4A and the silicon-terminated layer 5A.

Figure 2:
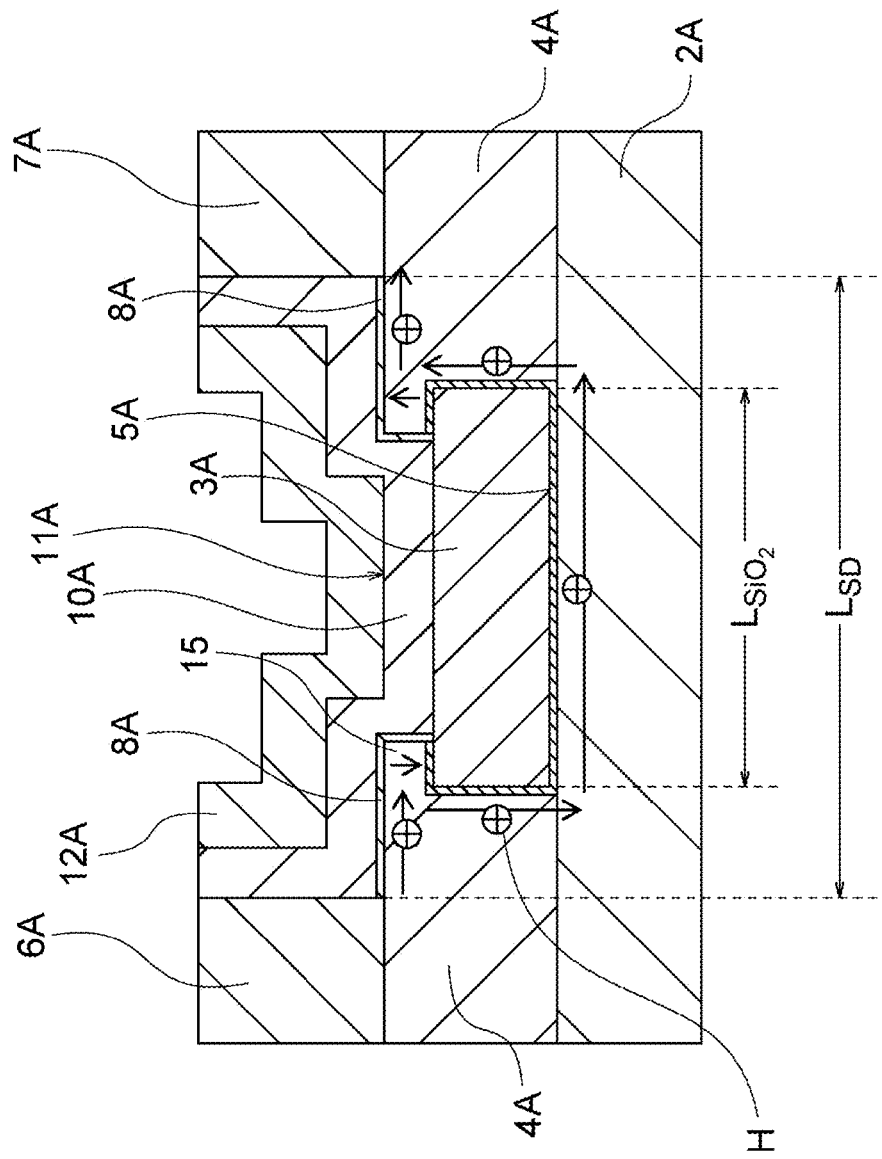
FIG. 2 is an operation explanatory view of the FET according to the first embodiment of the invention.

The peak C1 of Sample 3 showed an intensity stronger than that of C1 in NPL 1 in which C—Si bonds of a monolayer were analyzed by XPS (see FIG. 2 of NPL 1). This indicates that the silicon-terminated layer 5B containing C—Si bonds may not be a single layer but a plurality of layers may be present at the interface between the non-doped diamond layer 2B and the silicon oxide film 3B. This is considered to be the same for the treatment of forming the non-doped diamond layers 4A and the silicon-terminated layer 5A.

Fourth Example

In a fourth example, a sample for analysis produced up to a stage when the non-doped diamond layers 4A were formed in the same manner as in the first example was produced (hereinafter referred to as Sample 4). The sample for analysis produced up to the stage when the non-doped diamond layers 4A were formed in the same manner as in the first example was used for cross-sectional observation and elemental analysis of Sample 4. Sample 4 was subjected to a hydrogen fluoride (HF) treatment for the cross-sectional observation and elemental analysis, and was then subjected to observation by a transmission electron microscopy (TEM) and elemental analysis by X-rays on a TEM observation site. An energy dispersive X-ray spectroscopy (EDS) device was used for the elemental analysis by X-rays.

Figure 26A:
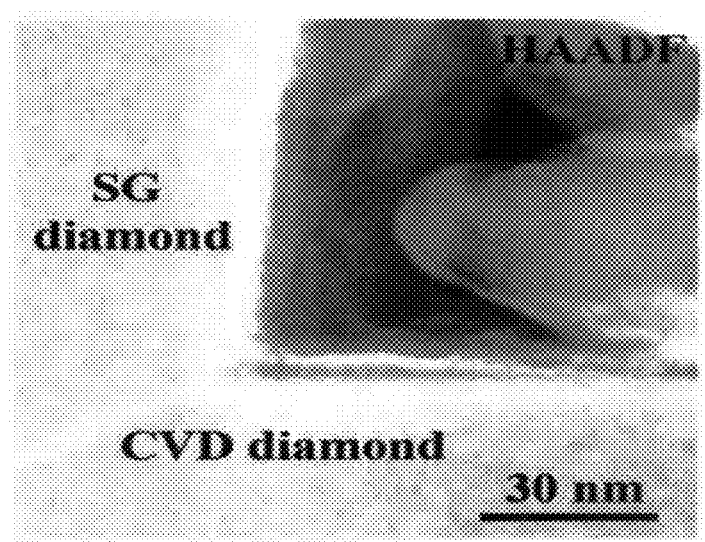
FIG. 26A is a view showing a result of cross-sectional observation and elemental analysis of the FET 100A according to a fourth example of the invention, and is an imaging view obtained by a TEM.

FIG. 26A is a TEM observation image of a cross section of Sample 4. A high-angle annular dark field scanning TEM (HAADF-STEM) was used for the observation. The observation site was a corner portion where the silicon oxide film 3A, the diamond layer 2A, and the non-doped diamond layer 4A were in contact with each other in the FET 100A.

In FIG. 26A, the diamond layer 2A is present in a horizontal direction in a certain region described as "CVD diamond" in a lower part of the drawing. The non-doped diamond layer 4A is present in a vertical direction in a certain region described as "SG diamond" on a left side in the drawing. The silicon oxide film 3A is dissolved by the hydrogen fluoride treatment before the TEM observation, and a dark region from a center to an upper right side in the drawing is a region where the silicon oxide film 3A was present before the hydrogen fluoride treatment.

Figure 26B:
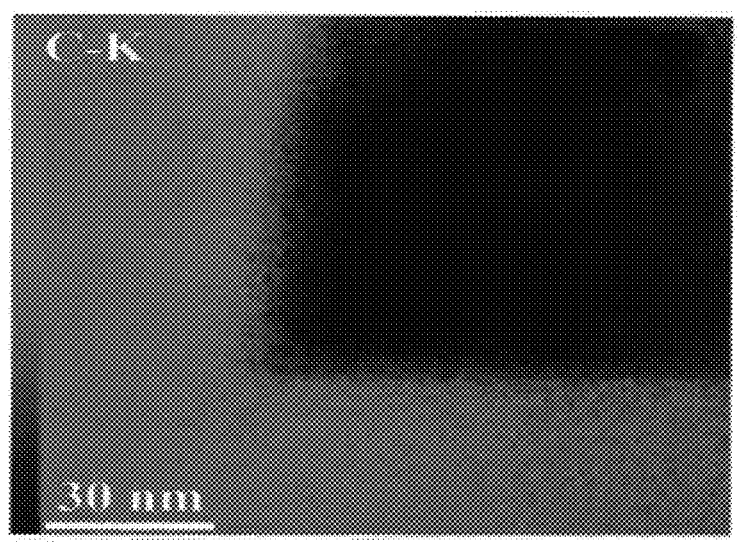
FIG. 26B is a view showing a result of cross-sectional observation and elemental analysis of the FET 100A according to the fourth example of the invention, and is a view showing a detection result of C atoms.
Figure 26C:
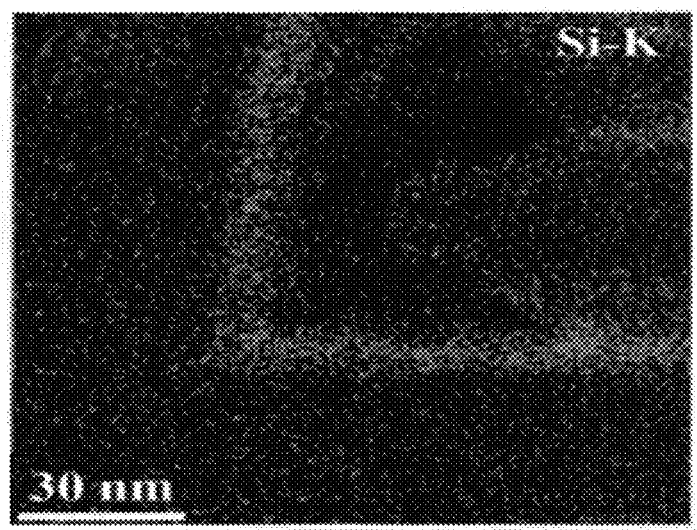
FIG. 26C is a view showing a result of cross-sectional observation and elemental analysis of the FET 100A according to the fourth example of the invention, and is a view showing a detection result of Si atoms.

Subsequently, the same portion of Sample 4 as in FIG. 26A was subjected to the elemental analysis by X-rays. C atoms were detected in the entire region where the diamond layer 2A and the non-doped diamond layer 4A were present (FIG. 26B). At an interface between the diamond layer 2A and the silicon oxide film 3A (in a horizontal direction in the drawing) and at an interface between the non-doped diamond layer 4A and the silicon oxide film 3A (in a vertical direction in the drawing), Si atoms were detected along the respective interfaces (FIG. 26C). As shown in FIG. 26C, it was confirmed that the Si atoms were distributed in a strip shape.

Figure 26D:
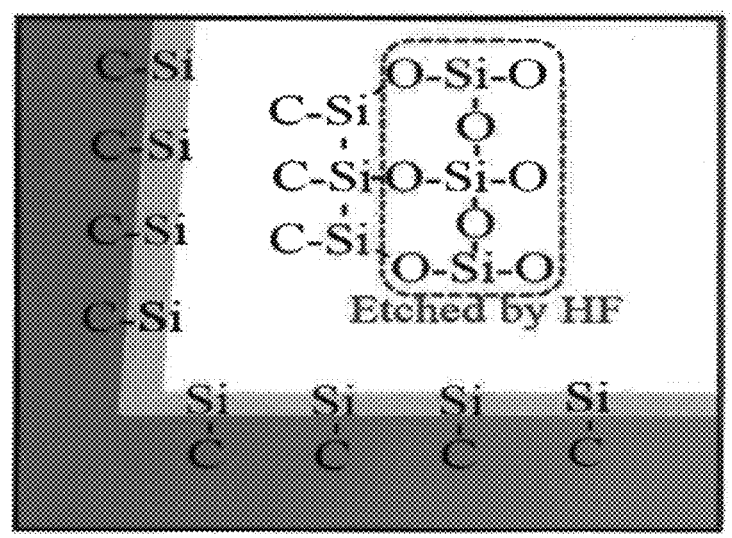
FIG. 26D is a view showing a result of cross-sectional observation and elemental analysis of the FET 100A according to the fourth example of the invention, and is a schematic view showing an elemental analysis result.

FIG. 26D is a schematic view showing a result of the elemental analysis. The silicon oxide film 3A is dissolved in hydrogen fluoride and removed. On the other hand, C—Si bonds are not dissolved in hydrogen fluoride and are not removed. This clearly shows that the Si atoms detected in FIG. 26C are not Si atoms existing in the silicon oxide film 3A but Si atoms in the C—Si bonds. That is, from the above elemental analysis result, it was found that the silicon-terminated layer 5A containing the C—Si bonds was present at the interface between the diamond layer 2A and the silicon oxide film 3A and at the interface between the non-doped diamond layer 4A and the silicon oxide film 3A. The inventors have thus concluded that these C—Si bonds were formed by reaction of Si atoms desorbed from the silicon oxide film 3A by a reduction reaction with C atoms in the diamond layer 2A and the diamond layers 4A.

REFERENCE SIGN LIST 100A, 100B: diamond field effect transistor
1A, 1B: diamond substrate
2A, 2B: diamond layer
3A, 3B: silicon oxide film
4A: non-doped diamond layer
4a: overhang portion
4B: boron-doped diamond layer
5A, 5B: silicon-terminated layer
6A, 6B: source electrode
7A, 7B: drain electrode
8A, 8B: hydrogen-terminated layer
9A, 9B: device isolation layer
10A, 10B: insulating film
11A, 11B: gate insulating film
12A, 12B: gate electrode
30: photoresist

The invention claimed is:

1. A diamond field effect transistor comprising:
a first diamond layer;
a gate insulating film including a silicon oxide film provided on a surface of the first diamond layer;
a source region and a drain region provided on the surface of the first diamond layer so as to be separated from each other; and
a gate electrode provided on the gate insulating film, wherein
a silicon-terminated layer containing C—Si bonds formed of bonds between carbon atoms and silicon atoms is provided at an interface between the first diamond layer and the gate insulating film;
wherein the source region and the drain region are second diamond layers formed in regions on the surface of the first diamond layer other than a region where the silicon oxide film is formed; and
wherein the diamond field effect transistor further comprises:
a source electrode and a drain electrode provided on surfaces of the second diamond layers in the source region and the drain region and respectively connected to the source region and the drain region at predetermined intervals from end portions of the source region and the drain region, wherein
a hydrogen-terminated layer containing C—H bonds formed of a bond between a carbon atom and a hydrogen atom is provided on the surface of the second diamond layer at least within the predetermined interval.

2. A method for producing a diamond field effect transistor, the method comprising:
forming a gate insulating film including a silicon oxide film on a surface of a first diamond layer;
forming a source region and a drain region on the surface of the first diamond layer;
forming a gate electrode on the gate insulating film; and
forming a silicon-terminated layer containing C—Si bonds formed of bonds between carbon atoms and silicon atoms at an interface between the first diamond layer and the silicon oxide film, wherein
forming the source region and the drain region on the surface of the first diamond layer includes removing a part of the silicon oxide film to expose a part of the surface of the first diamond layer, and selectively epitaxially growing a second diamond layer on the exposed surface of the first diamond layer, and
wherein the method further comprises:
forming a silicon-terminated layer including C—Si bonds formed of bonds between carbon atoms and silicon atoms at an interface between the second diamond layer and the silicon oxide film, wherein forming the silicon-terminated layer containing the C—Si bonds at the interface between the first diamond layer and the silicon oxide film, forming the silicon-terminated layer containing the C—Si bonds at the interface between the second diamond layer and the silicon oxide film, and selectively epitaxially growing the second diamond layer on the exposed surface of the first diamond layer, are performed simultaneously by a plasma treatment in the same reducing atmosphere.

3. A method for producing a diamond field effect transistor, the method comprising:
forming a gate insulating film including a silicon oxide film on a surface of a first diamond layer;
forming a source region and a drain region on the surface of the first diamond layer;
forming a gate electrode on the gate insulating film; and
forming a silicon-terminated layer containing C—Si bonds formed of bonds between carbon atoms and silicon atoms at an interface between the first diamond layer and the silicon oxide film, wherein
forming the source region and the drain region on the surface of the first diamond layer includes removing a part of the silicon oxide film to expose a part of the surface of the first diamond layer, and selectively epitaxially growing a second diamond layer on the exposed surface of the first diamond layer, and
wherein the method further comprises:
forming a source electrode and a drain electrode on surfaces of the second diamond layers respectively connected thereto at predetermined intervals from end portions of the silicon oxide film, and forming a hydrogen-terminated layer containing C—H bonds formed of bonds between carbon atoms and hydrogen atoms on the surface of the second diamond layer at least within the predetermined interval.

* * * * *